(12) United States Patent
Fallon

(10) Patent No.: US 6,604,158 B1
(45) Date of Patent: Aug. 5, 2003

(54) SYSTEM AND METHODS FOR ACCELERATED DATA STORAGE AND RETRIEVAL

(75) Inventor: James J. Fallon, Armonk, NY (US)

(73) Assignee: Realtime Data, LLC, New York, NY (US)

( * ) Notice: Subject to any disclaimer, the term of this patent is extended or adjusted under 35 U.S.C. 154(b) by 0 days.

(21) Appl. No.: 09/481,243

(22) Filed: Jan. 11, 2000

Related U.S. Application Data

(63) Continuation-in-part of application No. 09/266,394, filed on Mar. 11, 1999.

(51) Int. Cl.[7] .............................................. G06F 13/12
(52) U.S. Cl. ........................... 710/65; 710/68; 709/246
(58) Field of Search ........................... 710/1, 5, 62, 65, 710/68, 20, 52, 60, 61; 709/247, 246; 341/97, 95; 711/4

(56) References Cited

U.S. PATENT DOCUMENTS

| | | | |
|---|---|---|---|
| 4,574,351 A | | 3/1986 | Dang et al. |
| 4,730,348 A | * | 3/1988 | MacCrisken ................ 375/122 |
| 4,804,959 A | | 2/1989 | Makansi et al. |
| 4,870,415 A | | 9/1989 | Van Maren et al. |
| 4,906,995 A | * | 3/1990 | Swanson ...................... 341/95 |
| 4,965,675 A | | 10/1990 | Hori et al. |
| 5,028,922 A | | 7/1991 | Huang |
| 5,046,027 A | | 9/1991 | Taaffe et al. |
| 5,049,881 A | * | 9/1991 | Gibson et al. ................ 341/95 |
| 5,150,430 A | | 9/1992 | Chu |
| 5,159,336 A | | 10/1992 | Rabin et al. |
| 5,179,651 A | | 1/1993 | Taaffe et al. |
| 5,237,460 A | | 8/1993 | Miller et al. |
| 5,237,675 A | | 8/1993 | Hannon, Jr. |
| 5,247,638 A | | 9/1993 | O Brien et al. |
| 5,247,646 A | | 9/1993 | Osterlund et al. |
| 5,287,420 A | | 2/1994 | Barrett |
| 5,357,614 A | | 10/1994 | Pattisam et al. |
| 5,406,278 A | * | 4/1995 | Graybill et al. ................ 341/51 |
| 5,414,850 A | | 5/1995 | Whiting |
| 5,535,356 A | | 7/1996 | Kim et al. |

(List continued on next page.)

Primary Examiner—Jeffrey Gaffin
Assistant Examiner—Rijue Mai
(74) Attorney, Agent, or Firm—F. Chau & Associates, LLP; Frank V. DeRosa, Esq.

(57) ABSTRACT

Systems and methods for providing accelerated data storage and retrieval utilizing lossless and/or lossy data compression and decompression. A data storage accelerator includes one or a plurality of high speed data compression encoders that are configured to simultaneously or sequentially losslessly or lossy compress data at a rate equivalent to or faster than the transmission rate of an input data stream. The compressed data is subsequently stored in a target memory or other storage device whose input data storage bandwidth is lower than the original input data stream bandwidth. Similarly, a data retrieval accelerator includes one or a plurality of high speed data decompression decoders that are configured to simultaneously or sequentially losslessly or lossy decompress data at a rate equivalent to or faster than the input data stream from the target memory or storage device. The decompressed data is then output at rate data that is greater than the output rate from the target memory or data storage device. The data storage and retrieval accelerator method and system may employed: in a disk storage adapter to reduce the time required to store and retrieve data from computer to disk; in conjunction with random access memory to reduce the time required to store and retrieve data from random access memory; in a display controller to reduce the time required to send display data to the display controller or processor; and/or in an input/output controller to reduce the time required to store, retrieve, or transmit data.

16 Claims, 20 Drawing Sheets

U.S. PATENT DOCUMENTS

| | | |
|---|---|---|
| 5,537,658 A | 7/1996 | Bakke et al. |
| 5,561,824 A | 10/1996 | Carreiro et al. |
| 5,574,952 A | 11/1996 | Brady et al. |
| 5,574,953 A | 11/1996 | Rust et al. |
| 5,590,306 A | 12/1996 | Watanabe et al. |
| 5,606,706 A | 2/1997 | Takamoto et al. |
| 5,615,017 A | 3/1997 | Choi |
| 5,621,820 A | 4/1997 | Rynderman et al. |
| 5,623,623 A | 4/1997 | Kim et al. |
| 5,623,701 A | 4/1997 | Bakke et al. |
| 5,627,995 A | 5/1997 | Miller et al. |
| 5,630,092 A | 5/1997 | Carreiro et al. |
| 5,652,857 A | 7/1997 | Shimoi et al. |
| 5,652,917 A | 7/1997 | Maupin et al. |
| 5,655,138 A | 8/1997 | Kikinis |
| 5,666,560 A | 9/1997 | Moertl et al. |
| 5,671,389 A | 9/1997 | Saliba |
| 5,694,619 A | 12/1997 | Konno |
| 5,696,927 A | 12/1997 | MacDonald et al. |
| 5,715,477 A | 2/1998 | Kikinis |
| 5,721,958 A | 2/1998 | Kikinis |
| 5,724,475 A | 3/1998 | Kirsten |
| 5,778,411 A | 7/1998 | DeMoss et al. |
| 5,787,487 A | 7/1998 | Hashimoto et al. |
| 5,809,337 A | 9/1998 | Hannah et al. |
| 5,812,789 A | 9/1998 | Diaz et al. |
| 5,832,037 A * | 11/1998 | Park ............................. 375/240 |
| 5,832,126 A * | 11/1998 | Tanaka ......................... 382/239 |
| 5,838,996 A | 11/1998 | deCarmo |
| 5,847,762 A | 12/1998 | Canfield et al. |
| 5,870,087 A | 2/1999 | Chau |
| 5,889,961 A | 3/1999 | Dobbek |
| 5,915,079 A | 6/1999 | Vondran, Jr. et al. |
| 5,936,616 A | 8/1999 | Torborg, Jr. et al. |
| 5,960,465 A | 9/1999 | Adams |
| 5,968,149 A | 10/1999 | Jaquette et al. |
| 5,973,630 A * | 10/1999 | Heath ........................... 341/87 |
| 5,974,471 A | 10/1999 | Belt |
| 5,996,033 A | 11/1999 | Chiu-Hao |
| 6,000,009 A | 12/1999 | Brady |
| 6,002,411 A | 12/1999 | Dye |
| 6,011,901 A | 1/2000 | Kirsten |
| 6,014,694 A | 1/2000 | Aharoni et al. |
| 6,028,725 A | 2/2000 | Blumenau |
| 6,032,148 A | 2/2000 | Wilkes |
| 6,317,714 B1 * | 11/2001 | Del Castillo et al. ........ 704/270 |

* cited by examiner

SYSTEM AND METHODS FOR ACCELERATED DATA STORAGE AND RETRIEVAL

CROSS REFERENCE TO RELATED APPLICATION

This application is a Continuation-in-Part of U.S. application Ser. No. 09/266,394 filed on Mar. 11, 1999.

BACKGROUND

1. Technical Field

The present invention relates generally to data storage and retrieval and, more particularly to systems and methods for improving data storage and retrieval bandwidth utilizing lossless and/or lossy data compression and decompression.

2. Description of the Related Art

Information may be represented in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video frequently exists in the natural world as analog information. As is well-known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossy and lossless data compression.

Lossy data compression techniques provide for an inexact representation of the original uncompressed data such that the decoded (or reconstructed) data differs from the original unencoded/uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the negentropy of a given data set.

It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

One problem with the current art is that the bandwidth and storage capacity of existing memory storage devices severely limit the performance of consumer, entertainment, office, workstation, servers, and mainframe computers for all disk and memory intensive operations. For example, magnetic disk mass storage devices currently employed in a variety of home, business, and scientific computing applications suffer from significant seek-time access delays along with profound read/write data rate limitations. Currently the fastest available (10,000) rpm disk drives support only a 22 Megabyte per second data rate (MB/sec). This is in stark contrast to the modern Personal Computer's Peripheral Component Interconnect (PCI) Bus's input/output capability of 528 MB/sec and internal local bus capability of over 1,064 MB/sec. Substantially faster processor, internal local bus memory, and I/O bus bandwidths are expected in the near future.

Another problem within the current art is that emergent high performance disk interface standards such as the Small Computer Systems Interface (SCSI-3) and Fibre Channel offer only the promise of higher data transfer rates through intermediate data buffering in random access memory. These interconnect strategies do not address the fundamental problem that all modern magnetic disk storage devices for the personal computer marketplace are still limited by the same physical media restriction of 22 MB/sec. Faster disk access data rates are only achieved by the high cost solution of simultaneously accessing multiple disk drives with a technique known within the art as data striping.

Additional problems with bandwidth limitations similarly occur within the art by all other forms of sequential, pseudo-random, and random access mass storage devices. Typically mass storage devices include magnetic and optical tape, magnetic and optical disks, and various solid-state mass storage devices. It should be noted that the present invention applies to all forms and manners of memory devices including storage devices utilizing magnetic, optical, and chemical techniques, or any combination thereof.

SUMMARY OF THE INVENTION

The present invention is directed to systems and methods for providing accelerated data storage and retrieval by utilizing lossless and lossy data compression and decompression. The present invention provides an effective increase of the data storage and retrieval bandwidth of a memory storage device. In one aspect of the present invention, a method for providing accelerated data storage comprises the steps of receiving a digital data stream at an input data transmission rate which is greater than a data storage rate of a target storage device, compressing the digital data stream at a compression rate that increases the effective data storage rate of the target storage device, and storing the compressed digital data stream in the target storage device. The step of compressing may be performed using lossless data compression, lossy data compression or a combination of lossless and lossy data compression.

In another aspect of the present invention, the compression process comprises the steps of reading a first parameter that is indicative of a compression type to be applied to the input digital data stream, and selecting at least one allowable encoder based on the first parameter.

In yet another aspect, the compression process further comprises the step of reading a second parameter that is indicative of an amount of information loss that is permissible, if lossy data compression is selected.

In another aspect of the present invention, a method for providing accelerated retrieval of stored data comprises the steps of retrieving a compressed digital data stream from a target storage device at a rate equal to a data access rate of the target storage device and decompressing the compressed data at a decompression rate that increases the effective data access rate of the target storage device. The step of compressing may be performed using lossless data compression, lossy data compression or a combination of lossless and lossy data compression.

In yet another aspect of the present invention, the decompression process comprises the steps of reading a first parameter that is indicative of a decompression type to be applied to the compressed digital data stream, and selecting at least one allowable decoder based on the first parameter.

In another aspect, the decompression process further comprises the step of reading a second parameter that is indicative of an amount of information loss that is permissible, if lossy data decompression is selected.

In yet another aspect of the present invention, the method for providing accelerated data storage utilizes a compression ratio that is at least equal to the ratio of the input data transmission rate to the data storage rate so as to provide continuous storage of the input data stream at the input data transmission rate. Moreover, the method for providing accelerated data retrieval utilizes a decompression ratio which is equal to or greater than the ratio of the data access rate to a maximum accepted output data transmission rate so as to provide a continuous and optimal data output transmission rate.

In another aspect of the present invention, data storage and retrieval acceleration is employed in a disk storage adapter to reduce the time required to store and retrieve data from computer to a disk memory device.

In another aspect of the present invention, data storage and retrieval acceleration is employed in conjunction with random access memory to reduce the time required to store and retrieve data from random access memory.

In another aspect of the present invention, data storage and retrieval acceleration is employed in a video data storage system to reduce the time required to store digital video data.

In another aspect of the present invention, data storage and retrieval acceleration is employed in a display controller to reduce the time required to send display data to the display controller or processor.

In another aspect of the present invention, data storage and retrieval acceleration is employed in an input/output controller to reduce the time required to store, retrieve, or transmit data various forms of data.

The present invention is realized due to recent improvements in processing speed, inclusive of dedicated analog and digital hardware circuits, central processing units, digital signal processors, dedicated finite state machines (and any hybrid combinations thereof), that, coupled with advanced data compression and decompression algorithms, are enabling of ultra high bandwidth data compression and decompression methods that enable improved data storage and retrieval bandwidth.

These and other aspects, features and advantages, of the present invention will become apparent from the following detailed description of preferred embodiments, that is to be read in connection with the accompanying drawings.

DETAILED DESCRIPTION OF PREFERRED EMBODIMENTS

Figure 1:
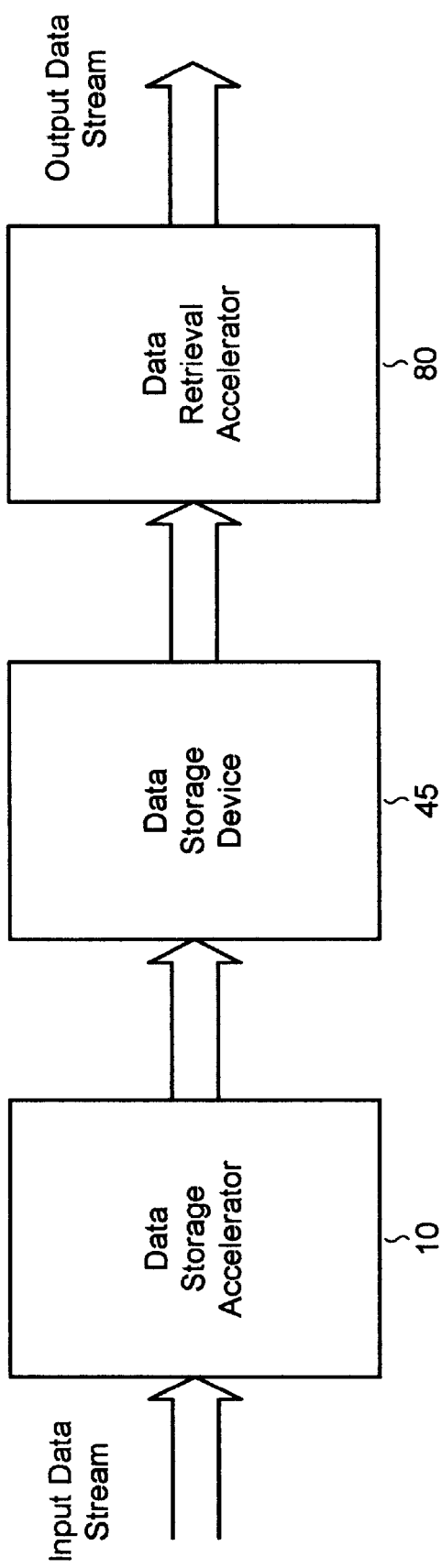
FIG. 1 is a block diagram of a system for accelerated data storage and retrieval according to one embodiment of the present invention.

The present invention is directed to systems and methods for providing improved data storage and retrieval bandwidth utilizing both lossless and lossy data compression and decompression. In the following description, it is to be understood that system elements having equivalent or similar functionality are designated with the same reference numerals in the Figures. It is to be further understood that the present invention may be implemented in various forms of digital and/or analog hardware, software, firmware, or a combination thereof. Preferably, the present invention is implemented on a computer platform including hardware such as one or more central processing units (CPU) or digital signal processors (DSP), a random access memory (RAM), and input/output (I/O) interface(s). The computer platform may also include an operating system, microinstruction code, and dedicated processing hardware utilizing combinatorial logic, finite state machines, analog signal processing. The various processes and functions described herein may be either part of the hardware, microinstruction code or application programs that are executed via the operating system, or any combination thereof.

It is to be further understood that, because some of the constituent system components described herein are preferably implemented as software modules, the actual system connections shown in the Figures may differ depending upon the manner in that the systems are programmed. It is to be appreciated that special purpose microprocessors, digital signal processors, analog signal processors, dedicated hardware, or and combination thereof may be employed to implement the present invention. Given the teachings herein, one of ordinary skill in the related art will be able to contemplate these and similar implementations or configurations of the present invention.

Referring now to FIG. 1, a block diagram illustrates a system for accelerated data storage and retrieval in accordance with an embodiment of the present invention. The system inlcudes a data storage accelerator 10 that is operatively coupled to a data storage device 45. The data storage accelerator operates to increase the effective data storage rate of the data storage device 45. It is to be appreciated that the data storage device 45 may be any form of memory device including all forms of sequential, pseudo-random, and random access storage devices. The memory storage device 45 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including, but not limited to, storage devices utilizing magnetic, optical, and chemical techniques, or any combination thereof.

The data storage accelerator 10 receives and processes data blocks from an input data stream. The data blocks may range in size from individual bits through complete files or collections of multiple files, and the data block size may be fixed or variable. In order to achieve continuous data storage acceleration, the data storage accelerator 10 must be configured to compress a given input data block utilizing lossless or lossy data compression at a rate that is equal to or faster than receipt of the input data. Thus, to achieve optimum throughput, the rate that data blocks from the input data stream may be accepted by the data storage accelerator 10 is a function of the size of each input data block, the compression ratio achieved, and the bandwidth of the target storage device. For example, if the data storage device 45 (e.g., a typical target mass storage device) is capable of storing 30 megabytes per second and the data storage accelerator 10 is capable of providing an average compression ratio of 3:1, then 90 megabytes per second may be accepted as input and the data storage acceleration is precisely 3:1, equivalent to the average compression ratio.

It should be noted that it is not a requirement of the present invention to configure the storage accelerator 10 to compress a given input data block at a rate that is equal to or faster than receipt of the input data. Indeed, if the storage accelerator 10 compresses data at a rate that is less than the input data rate, buffering may be applied to accept data from the input data stream for subsequent compression. Further, since data may be received in high-speed bursts, the present invention may increase the effective bandwidth of the data storage process without increasing the instantaneous bandwidth of the data storage device.

Additionally, it is not a requirement that the data storage accelerator 10 utilize data compression with a ratio that is at least the ratio of the input data stream to the data storage access rate of the data storage device 45. Indeed, if the compression ratio is less than this ratio, the input data stream may be periodically halted to effectively reduce the rate of the input data stream. Alternatively, the input data stream or the output of the data accelerator 10 may be buffered to temporarily accommodate the mismatch in data bandwidth. An additional alternative is to reduce the input data rate to rate that is equal to or slower than the ratio of the input data rate to the data storage device access rate by signaling the data input source and requesting a slower data input rate, if possible.

Referring again to FIG. 1, a data retrieval accelerator 80 is operatively connected to and receives data from the data storage device 45. The data retrieval accelerator 80 receives and processes compressed data from data storage device 45 in data blocks that may range in size from individual bits through complete files or collections of multiple files. Additionally, the input data block size may be fixed or variable. The data retrieval accelerator 80 is configured to decompress each compressed data block which is received from the data storage device 45. In order to achieve continuous accelerated data retrieval, the data retrieval accelerator must decompress a given input data block at a rate that is equal to or faster than receipt of the input data.

In a manner analogous to the data storage accelerator 10, achieving optimum throughput with the data retrieval accelerator 80 is a function of the rate that compressed data blocks are retrieved from the data storage device 45, the size of each data block, the decompression ratio achieved, and the limitation on the bandwidth of the output data stream, if any. For example, if the data storage device 45 is capable of continuously supplying 30 megabytes per second and the data retrieval accelerator 80 is capable of providing an average decompression ratio of 1:3, then a 90 megabytes per second output data stream is achieved, and the corresponding data retrieval acceleration is precisely 1:3, equivalent to the average decompression ratio.

It is to be understood that it is not required that the data retrieval accelerator 80 utilize data decompression with a ratio that is at most equal to the ratio of the retrieval rate of the data storage device 45 to the maximum rate data output stream. Indeed, if the decompression ratio is greater than this ratio, retrieving data from the data storage device may be periodically halted to effectively reduce the rate of the output data stream to be at or below its maximum. Alternatively, the compressed data retrieved from the data storage device 45 or the output of the data decompressor may be buffered to temporarily accommodate the mismatch in data bandwidth. An additional alternative is to increase the output data rate by signaling or otherwise requesting the data output device (s) receiving the output data stream to accept a higher bandwidth, if possible.

Figure 2:
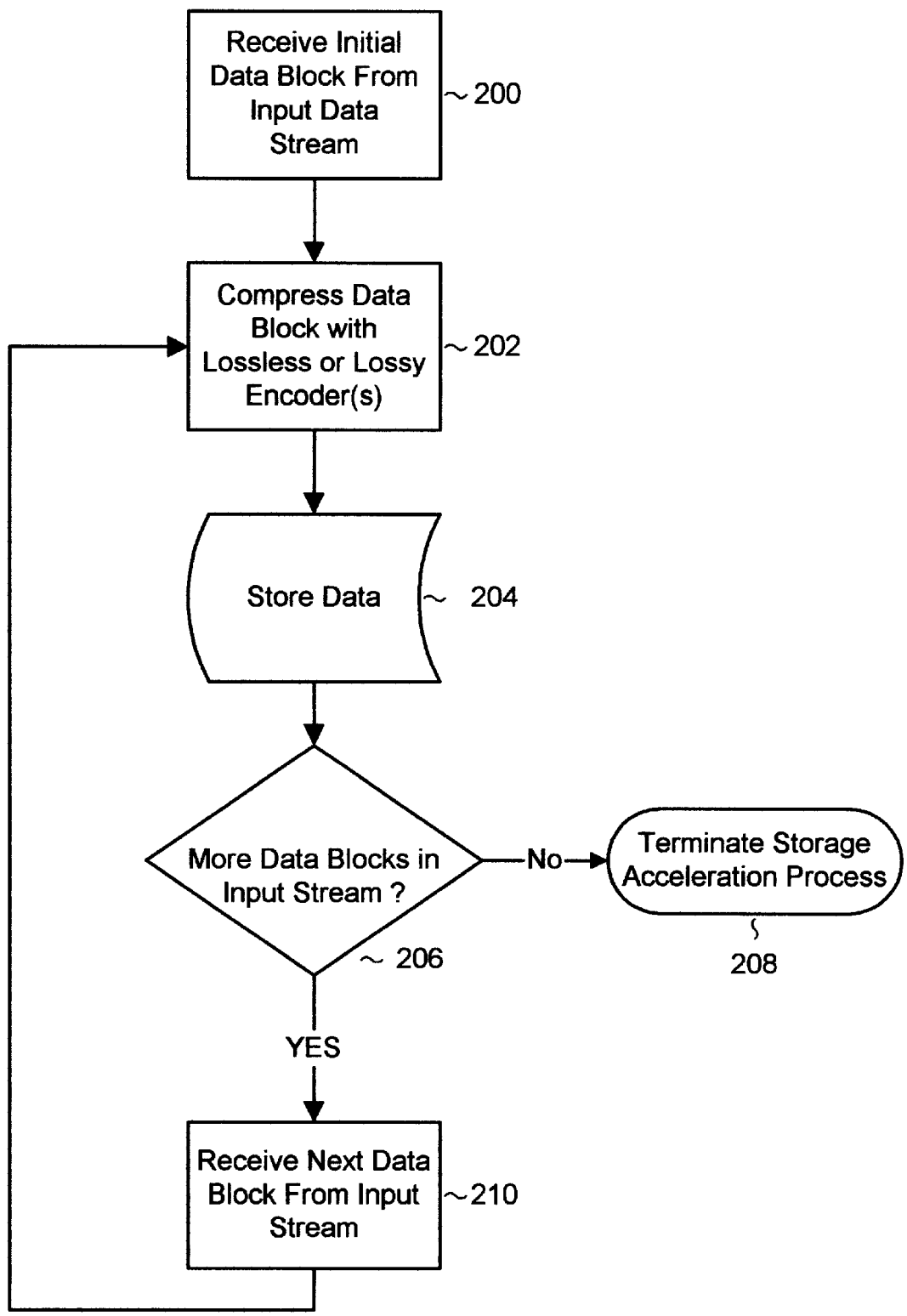
FIG. 2 is a flow diagram of a method for accelerated data storage in accordance with one aspect of the present invention.

Referring now to FIG. 2, a flow diagram of a method for accelerated data storage according to one aspect of the present invention illustrates the operation of the data storage acceleration shown in FIG. 1. As previously stated above, data compression is performed on a per data block basis. Accordingly, the initial input data block in the input data stream (step 200) is input into and compressed by the data storage accelerator 10 (step 202) utilizing lossless or lossy data compression, or any combination or permutation thereof. Upon completion of the encoding of the input data block, the encoded data block is then stored in the data storage device 45 (step 204). A check or other form of test is performed to see if there are additional data blocks available in the input stream (step 206). If no more data blocks are available, the storage acceleration process is terminated (step 208). If more data blocks are available in the input data stream, the next data block is received (step 210) and the process repeats beginning with data compression (step 202).

Figure 3:
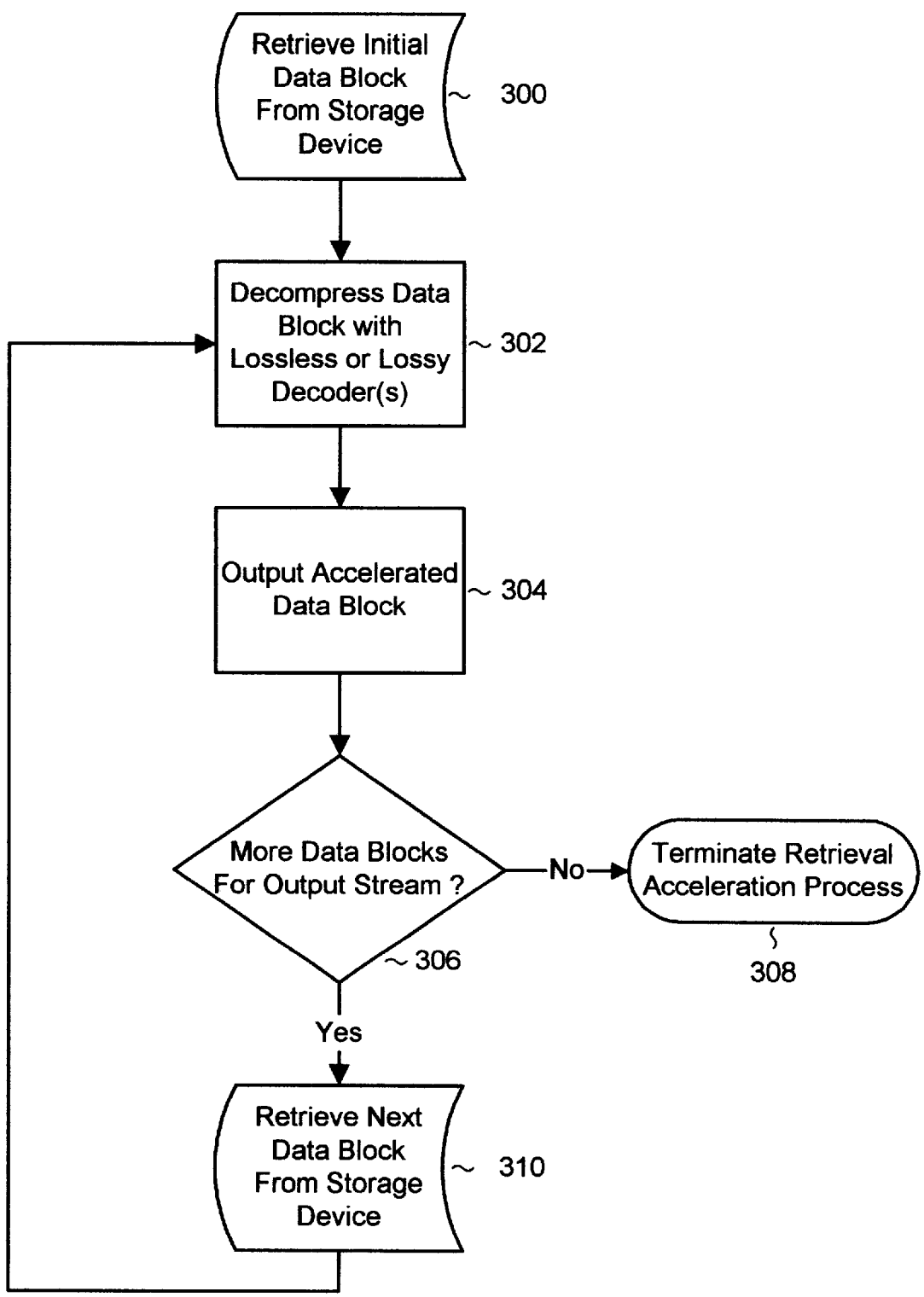
FIG. 3 is a flow diagram of a method for accelerated data retrieval in accordance with one aspect of the present invention.

Referring now to FIG. 3, a flow diagram of a method for accelerated data retrieval according to one aspect of the present invention illustrates the operation of the data retrieval accelerator 80 shown in FIG. 1. Data decompression is also performed on a per data block basis. The initial compressed data block is retrieved from the storage device 45 (step 300) and is decompressed by the data retrieval accelerator 80 (step 302) utilizing lossless or lossy data decompression, or any combination or permutation thereof. Upon completion of the decoding of the initial data block, the decoded data block is then output for subsequent processing, storage, or transmittal (step 304). A check or other form of test is performed to see if additional data blocks available from the data storage device (step 306). If no more data blocks are available, the data retrieval acceleration process is terminated (step 308). If more data blocks are available from the data storage device, the next data block is retrieved (step 310) and the process repeats beginning with data decompression (step 302).

Figure 4A:
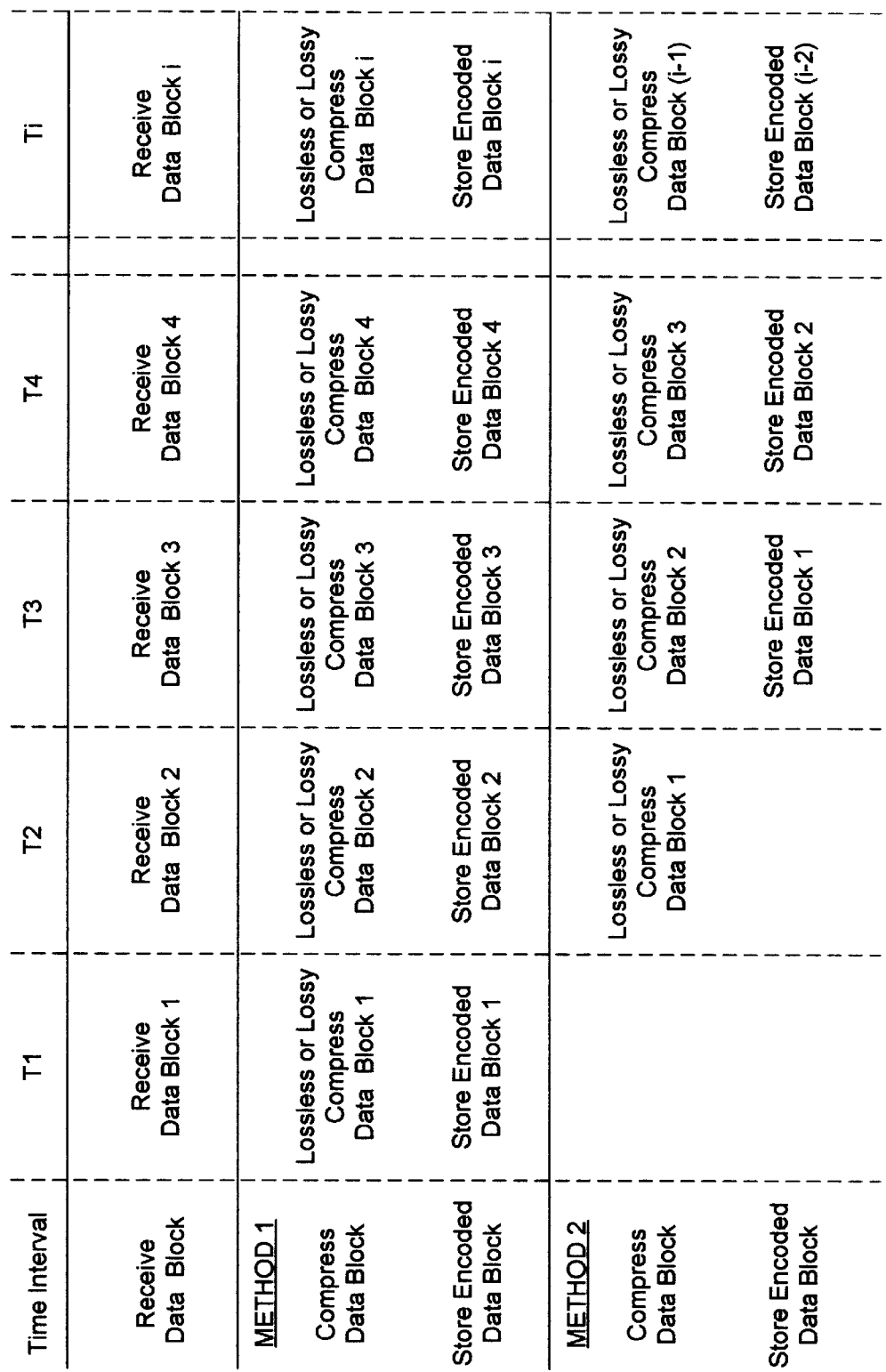
FIGS. 4a and 4b are timing diagrams of methods for accelerated data storage according to the present invention.
Figure 4B:
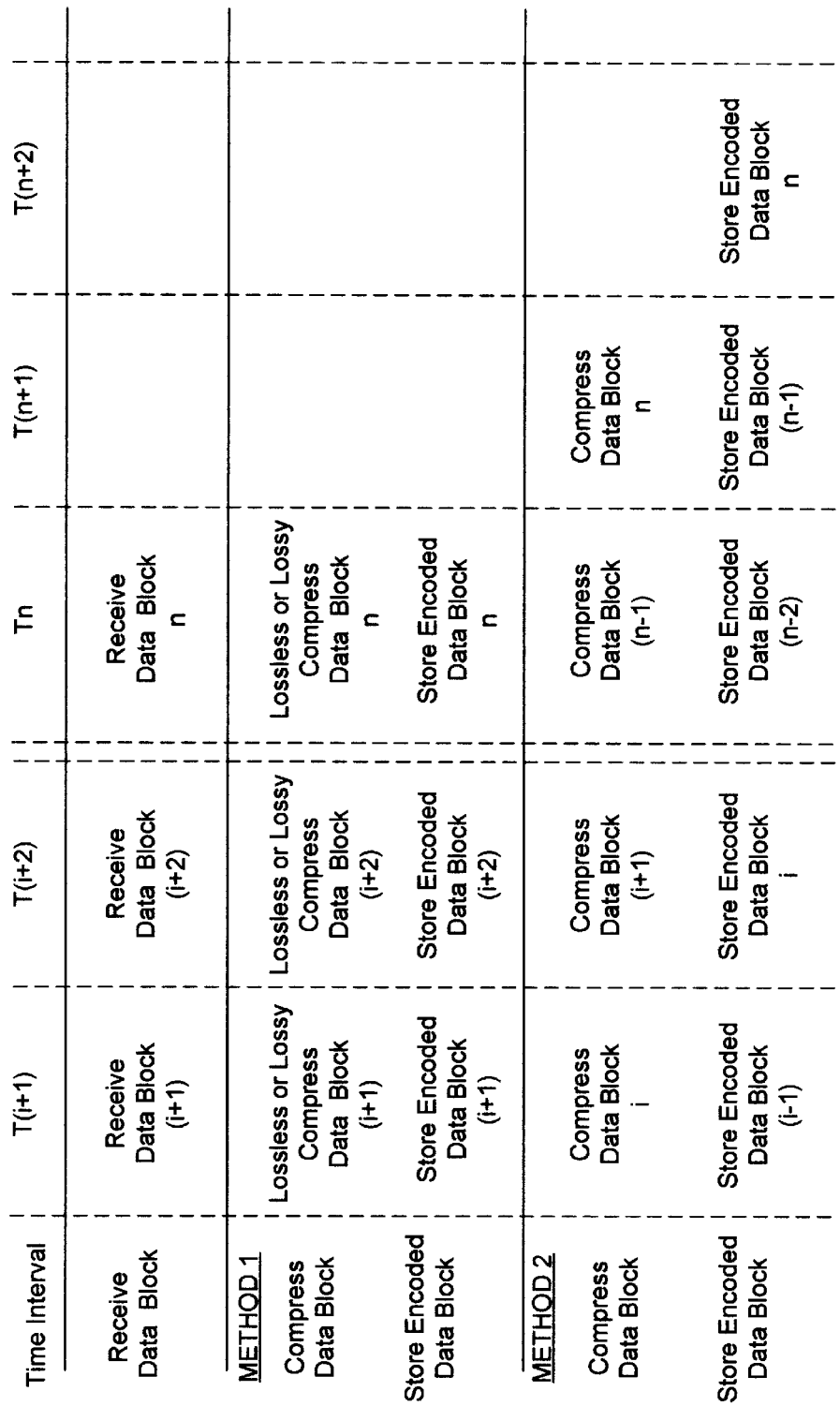

Referring now to FIGS. 4a and 4b, a timing diagram illustrates methods for accelerated data storage utilizing data compression in accordance with the present invention. Successive time intervals of equal duration are represented as T1 through T(n+2). Data block 1 is received from an input stream of one or more data blocks. Similarly, data block 2 through data block n are received during time intervals T2 through Tn, respectively. For the purposes of discussion, FIGS. 4a and 4b demonstrate one embodiment of the data storage utilizing a stream of n data blocks. As previously stated, the input data stream is comprised of one or more data blocks data blocks that may range in size from individual bits through complete files or collections of multiple files. Additionally, the input data block size may be fixed or variable.

In accordance with Method 1, lossless or lossy compression of data block 1 and subsequent storage of the encoded data block 1 occurs within time interval T1. Similarly, the compression and storage of each successive data block occurs within the time interval the data block is received. Specifically, data blocks 2 . . . n are compressed in time intervals T2 . . . Tn, respectively, and the corresponding encoded data blocks 2 . . . n are stored during the time intervals T2 . . . Tn, respectively. It is to be understood that Method 1 relies on data compression and encoding techniques that process data as a contiguous stream (i.e., not block oriented). It is well known within the current art that certain data compression techniques including, but not limited to, dictionary compression, run length encoding, null suppression and arithmetic compression are capable of encoding data when received. Additionally many lossy data techniques commonly applied to diffuse data also exhibit this same capability including, but not limited to adaptive differential pulse code modulation, linear predictive coding, linear prediction based analysis by synthesis coding, sub-band adaptive transformation and adaptive transform acoustic coding. It is to be appreciated that Method 1 possesses the advantage of introducing a minimum delay in the time from receipt of input to storage of encoded data blocks.

Referring again to FIGS. 4a and 4b, Method 2 illustrates compressing and storing data utilizing pipelined data processing. For Method 2, successive time intervals of equal duration are represented as T1 through T(n+2). Data block 1 is received from an input stream of one or more data blocks during time interval T1. Similarly, data block 2 through data block n are received during time intervals T2 through Tn, respectively. Compression of data block 1 occurs during time interval T2 and the storage of encoded data block 1 occurs during time interval T3. As shown by Method 2, compression of each successive data block occurs within the next time interval after the data block is received and data storage of the corresponding encoded data block occur in the next time interval after completion of data compression.

The pipelining of Method 2, as shown, utilizes successive single time interval delays for lossless or lossy data compression and data storage. Within the current invention, it is permissible to have increased pipelining to facilitate additional data processing or storage delays. For example, data compression processing for a single input data block may utilize more than one time interval. Accommodating more than one time interval for data compression requires additional data compressors to process successive data blocks, e.g., data compression processing of a single data block through three successive time intervals requires three data compressors, each processing a successive input data block. Due to the principle of causality, encoded data blocks are output only after compression encoding.

Method 2 provides for block oriented processing of the input data blocks. Within the current art, block oriented data compression techniques provide the opportunity for increased data compression ratios. This includes various forms of dictionary compression, along with many compression techniques commonly applied to diffuse image data including current standards by the Joint Photographic Experts Group, the Motion Picture Experts Group, vector quantitization, wavelet coding, and fractal coding. Method 2 may provide increased delay from receipt of input data block to storage of encoded data. However, depending on factors such as the size of input data blocks, the rate that they are received, the time required for data compression processing, the data compression ratio achieved, the bandwidth of the data storage device, and the intended application, the delay may or may not be significant. For example, in a modem database system, recording data for archival purposes, the opportunity for increased data compression may far outweigh the need for minimum delay. Conversely, in systems such as a military real-time video targeting system, minimizing delay is often of the essence. It should be noted that Method 1 and Method 2 are not mutually exclusive, and may be utilized in any combination.

Figure 5A:
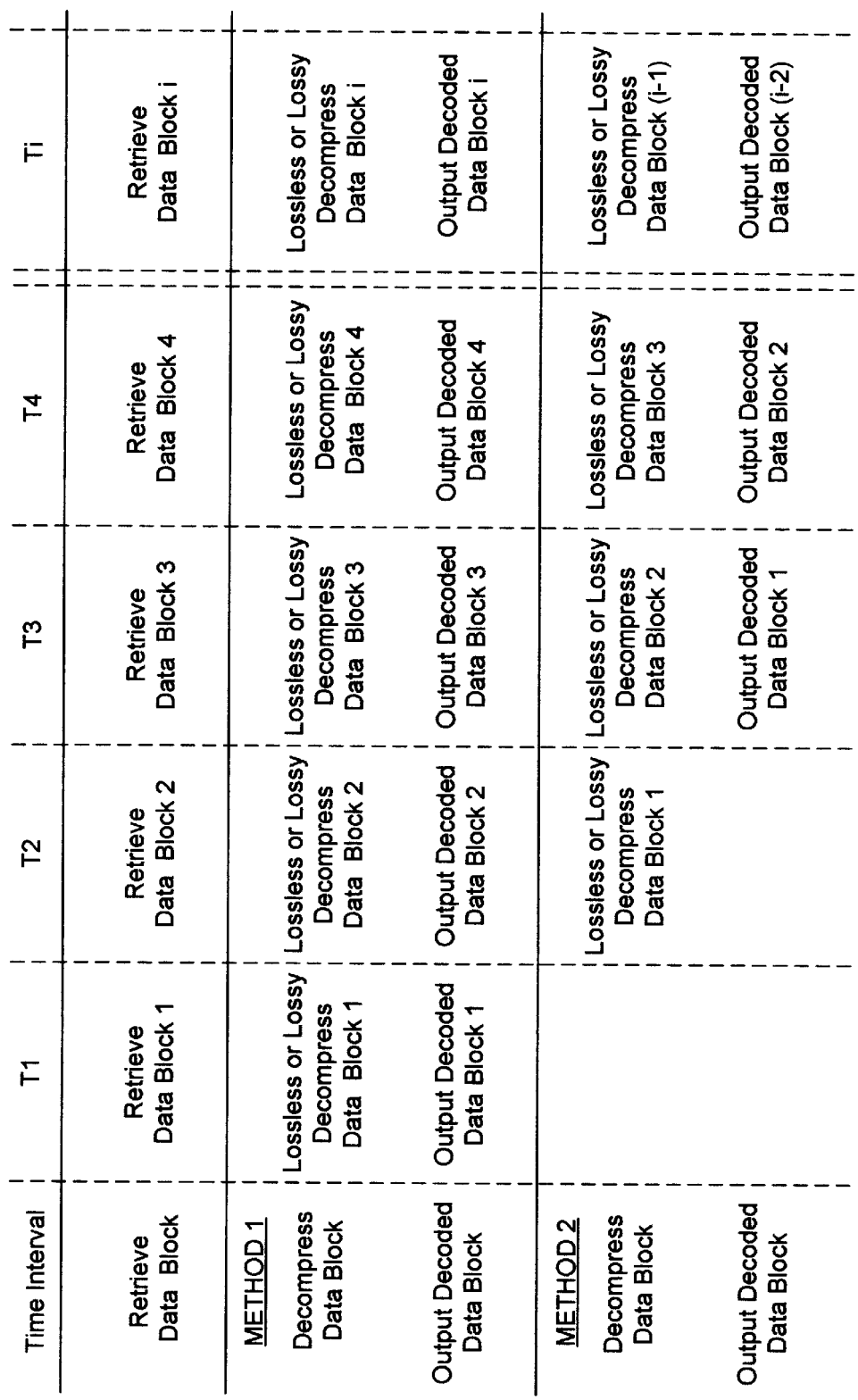
FIGS. 5a and 5b are timing diagrams of methods for accelerated data retrieval according to the present invention.
Figure 5B:
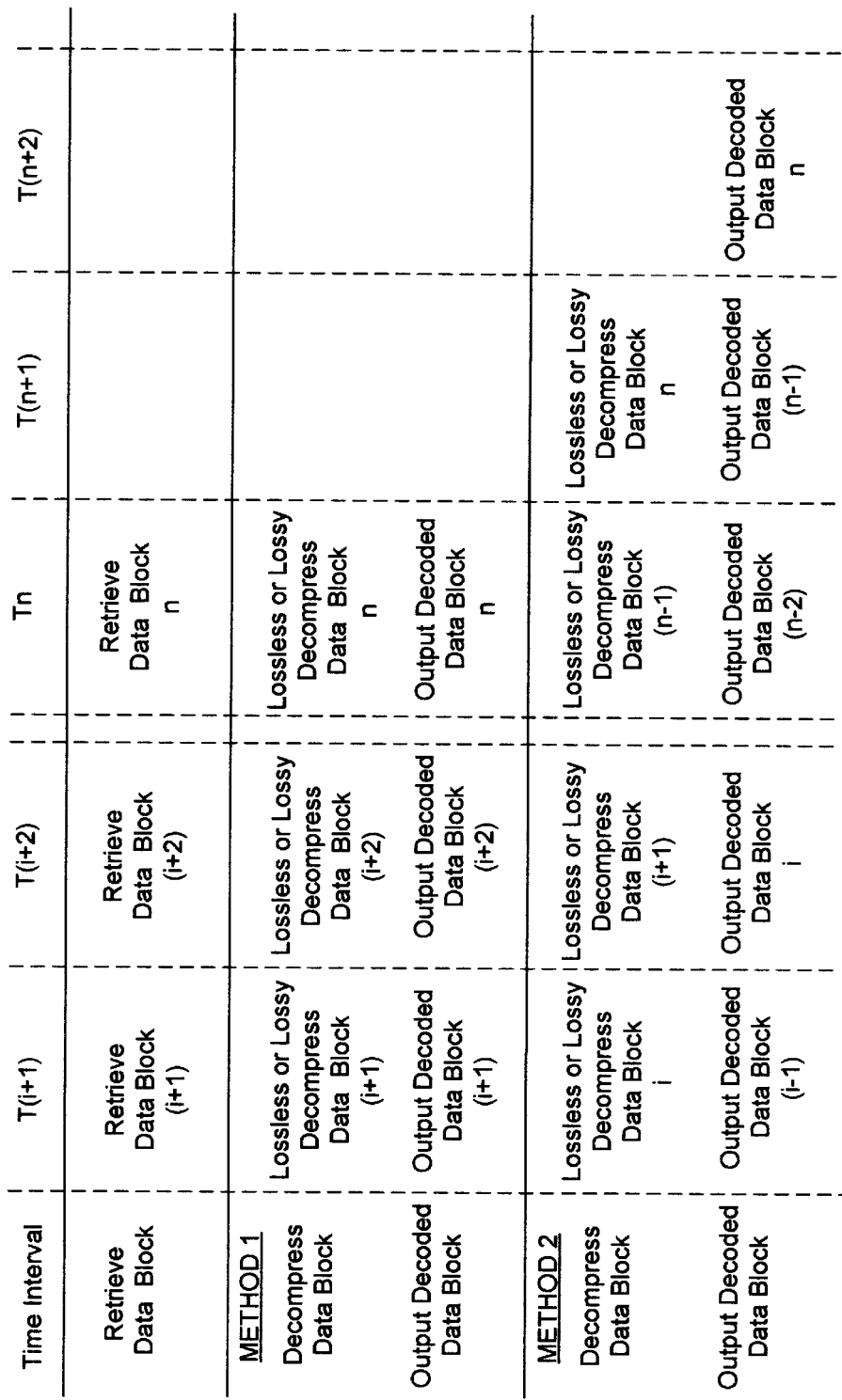

Referring now to FIGS. 5a and 5b, a timing diagram illustrates methods for accelerated data retrieval utilizing data decompression in accordance the present invention shown. Successive time intervals of equal duration are represented as T1 through T(n+2). Data block 1 is retrieved or otherwise accepted as input from one or more compressed data blocks retrieved from a data storage device. As shown, data block 2 through data block n are retrieved during time intervals T2 through Tn, respectively. For the purposes of discussion, FIGS. 5*a* and 5*b* demonstrate one embodiment of the data retrieval accelerator utilizing a stream of n data blocks. Once again, the retrieved data stream is comprised of one or more data blocks that may range in size from individual bits through complete files or collections of multiple files. Additionally, the retrieved data block size may be fixed or variable.

In accordance with Method 1, lossless or lossy decompression of data block 1 and subsequent outputting of the decoded data block 1 occurs within time interval T1. Similarly, decompression and outputting of each successive data block occurs within the time intervals they are retrieved. In particular, data block 2 through data block n are decompressed and decoded data block 2 through decoded data block n are output during time intervals T2 . . . Tn, respectively. It is to be understood that Method 1 relies on data decompression and decoding techniques that process compressed data as a contiguous stream (i.e., not block oriented). It is well known within the current art that certain data decompression techniques including, but not limited to, dictionary compression, run length encoding, null suppression and arithmetic compression are capable of decoding data when received. Method 1 possesses the advantage of introducing a minimum delay in the time from retrieval of compressed data to output of decoded data blocks.

Referring again to FIGS. 5*a* and 5*b*, Method 2 involves lossless or lossy decompression and output of data utilizing pipetined data processing. For Method 2, successive time intervals of equal duration are represented as T1 through T(n+2). Data block 1 through data block n are retrieved or otherwise accepted as input from a data storage device during time intervals T1 through Tn, respectively. Decompression of data block 1 occurs during time interval T2 and the decoded data block 1 is output during time interval T3. Similarly, decompression of each successive data block occurs within the next time interval after the data block is retrieved and the outputting of the decoded data block occurs during the next time interval after completion of data decompression.

The pipelining of Method 2, utilizes successive single time interval delays for data decompression and data output. Within the current invention, it is permissible to have increased pipelining to facilitate additional data retrieval or data decompression processing delays. For example, data decompression processing for a single input data block may utilize more than one time interval. Accommodating more than one time interval for data compression requires additional data decompressors to process successive compressed data blocks, e.g., data decompression processing of a single data block through three successive time intervals requires three data decompressors, each processing a successive input data block. Due to the principle of causality, decoded data blocks are only output after decompression decoding.

As before, Method 2 provides for block oriented processing of the retrieved data blocks. Within the current art, block oriented data decompression techniques provide the opportunity to utilize both lossless and lossy data compression encoders that increase data compression ratios. The disadvantage of method 2 is increased delay from retrieval of compressed data block to output of decompressed data. As previously discussed for data storage acceleration, depending on the size of retrieved data blocks, the rate that they are retrieved, the time required for data decompression processing, the data decompression ratio achieved, the bandwidth of the data output, and the intended application, the delay may or may not be significant.

Figure 6A:
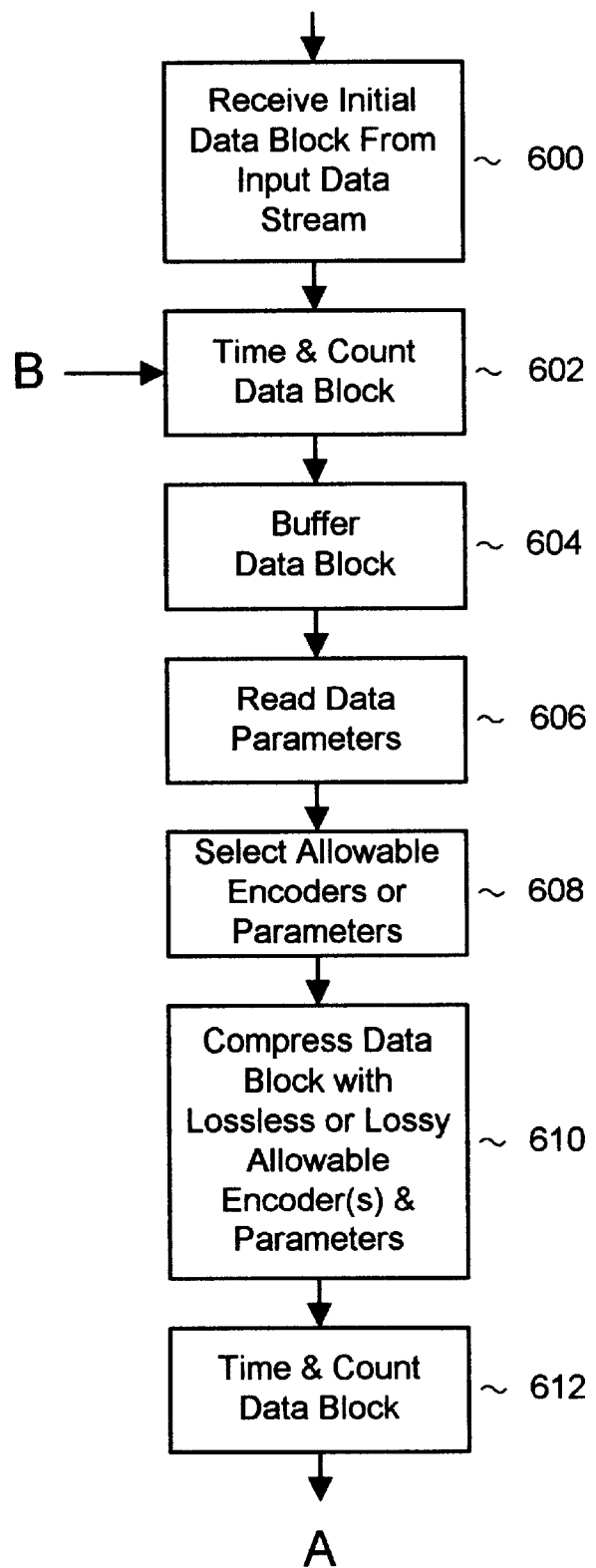
FIGS. 6a and 6b comprise a flow diagram of a method for accelerated data storage in accordance with a further aspect of the present invention.
Figure 6B:
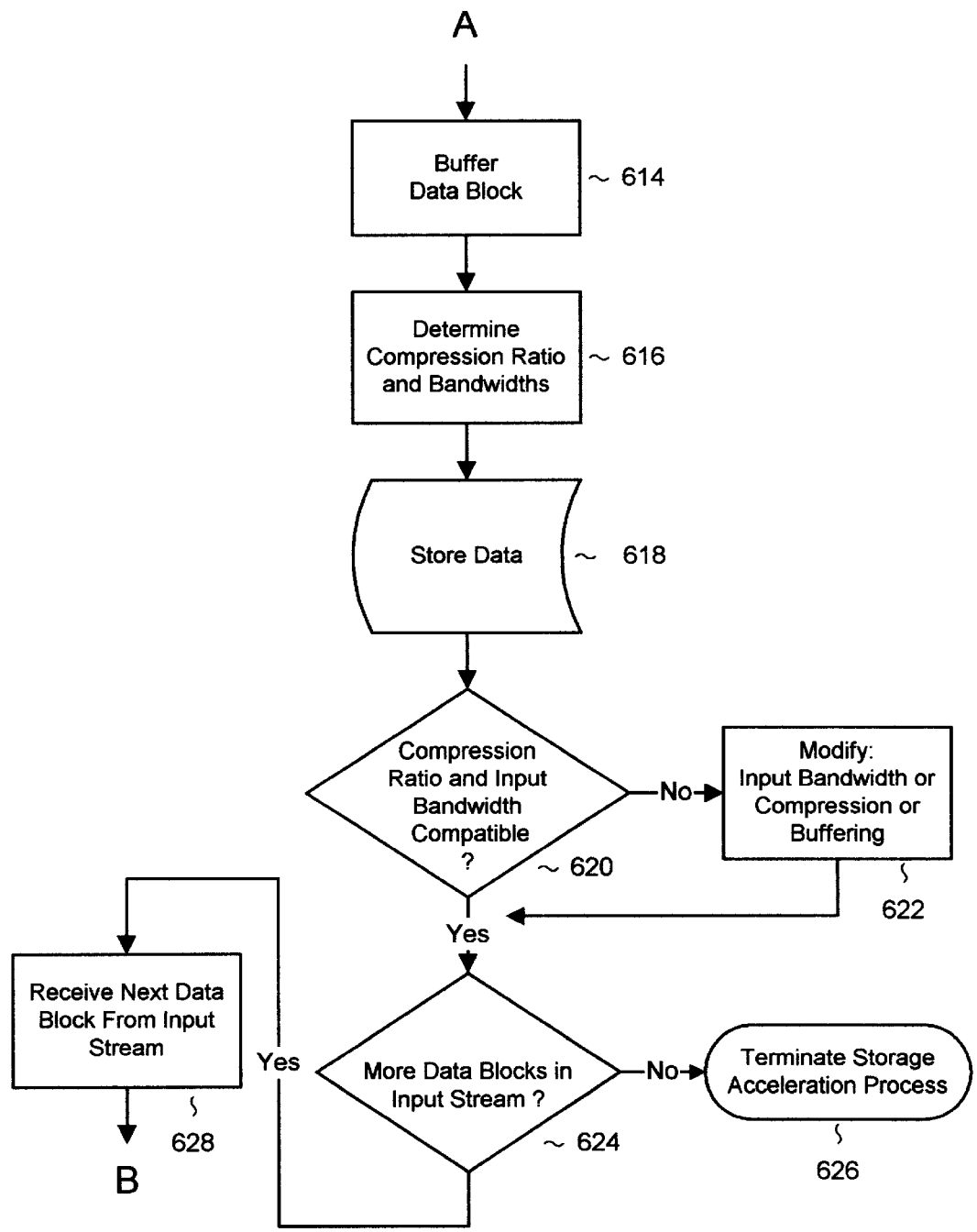

Referring now to FIGS. 6*a* and 6*b*, a flow diagram illustrates a method for accelerated data storage according to a further aspect of the present invention. With this method, the lossless or lossy data compression rate of the storage accelerator 10 is not required to be equal to or greater than the ratio of the input data rate to the data storage access rate. As previously stated above, data compression is performed on a per data block basis. Accordingly, the initial input data block in the input data stream is received (step 600) and then timed and counted (step 602). Timing and counting enables determination of the bandwidth of the input data stream. The input data block is then buffered (step 604).

Optionally, certain data parameters may be read (step 606) to determine whether the data may be compressed utilizing lossless or lossy techniques. If lossy techniques may be employed, additional parameters may also be included to indicate the amount of information loss that is permissible. Allowable encoders and associated parameters are then selected from the pool of available encoders (step 608). By way of example, in one embodiment, header information associated with a given data block or a series of data blocks may contain a binary flag that could be set to either logic "1" or logic "0" to indicate that the given data block or series of data blocks may be encoded using lossless or lossy data compression, respectively. In another embodiment, a multi-valued encoding parameter may be employed where all values true, for example a 16-bit value of FFFF (hexadecimal), signifies lossless encoding and where each value in the range from FFFE to 0000 denotes the amount of residual information content required. In a further embodiment, a list of encoding techniques may be added wherein each encoding techniques in the list is indexed and selected via using the above information content values. In yet a further embodiment, the values for the information content may possess different meanings dependent on system context. For example, an incoming video data stream may have an information value of 7FFF. This value may invoke a lossy encoder that scans a system parameter table which indicates video display or printer display resolution. With this information, the encoding algorithm can set the allowed information loss for the encoding process. It is to be understood that this technique may be applied to all forms of peripheral input and output devices.

The data is then compressed by the data storage accelerator 10 (step 610). During and after the encoding of the input data block, the encoded data block is then timed and counted (step 612), thus enabling determination of the compression ratio and compression bandwidth. The compressed, timed and counted data block is then buffered (step 614). The compression ratio and bandwidths of the input data stream and the encoder are then determined (step 616). The compressed data block is then stored in the data storage device 45 (step 618). Checks or other forms of testing are applied to ensure that the data bandwidths of the input data stream, data compressor, and data storage device are compatible (step 620). If the bandwidths are not compatible, then one or more system parameters may be modified to make the bandwidths compatible (step 622). For instance, the input bandwidth may be adjusted by either not accepting input data requests, lowering the duty cycle of input data requests, or by signaling one or more of the data sources that transmit the input data stream to request or mandate a lower data rate. In addition, the data compression ratio of the data storage accelerator 10 may be adjusted by applying a different type of encoding process such as employing lossless or lossy encoding, utilizing a single encoder, multiple parallel or sequential encoders, or any combination thereof to decrease encoding time, increase data compression ratio, or both. Furthermore, additional temporary buffering of either the input data stream or the compressed data stream (or both) may be utilized.

By way of example, assuming the input data rate is 90 MB/sec and the data storage accelerator 10 provides a compression ration of 3:1, then the output of the data storage accelerator 10 would be 30 MB/sec. If the maximum data storage rate of the data storage device 45 is 20 MB/sec (which is less than the data rate output from the data storage accelerator 10), data congestion and backup would occur at the output of the data storage accelerator 10. This problem may be solved by adjusting any one of the system parameters as discussed above, e.g., by adjusting the compression ratio to provide a data output rate from the data storage accelerator 10 to be equal to the data storage rate of the data storage device 45.

On the other hand, if the bandwidths are compatible (or made compatible by adjusting one or more of the system parameters), then a check or other form of test is performed to determine if there are additional data blocks available in the input stream (step 624). If no more data blocks are available, the storage acceleration process is terminated (step 626). If more data blocks are available in the input data stream, the next data block is received (step 628) and the process repeats beginning with timing and counting of the input data block (step 602).

Figure 7A:
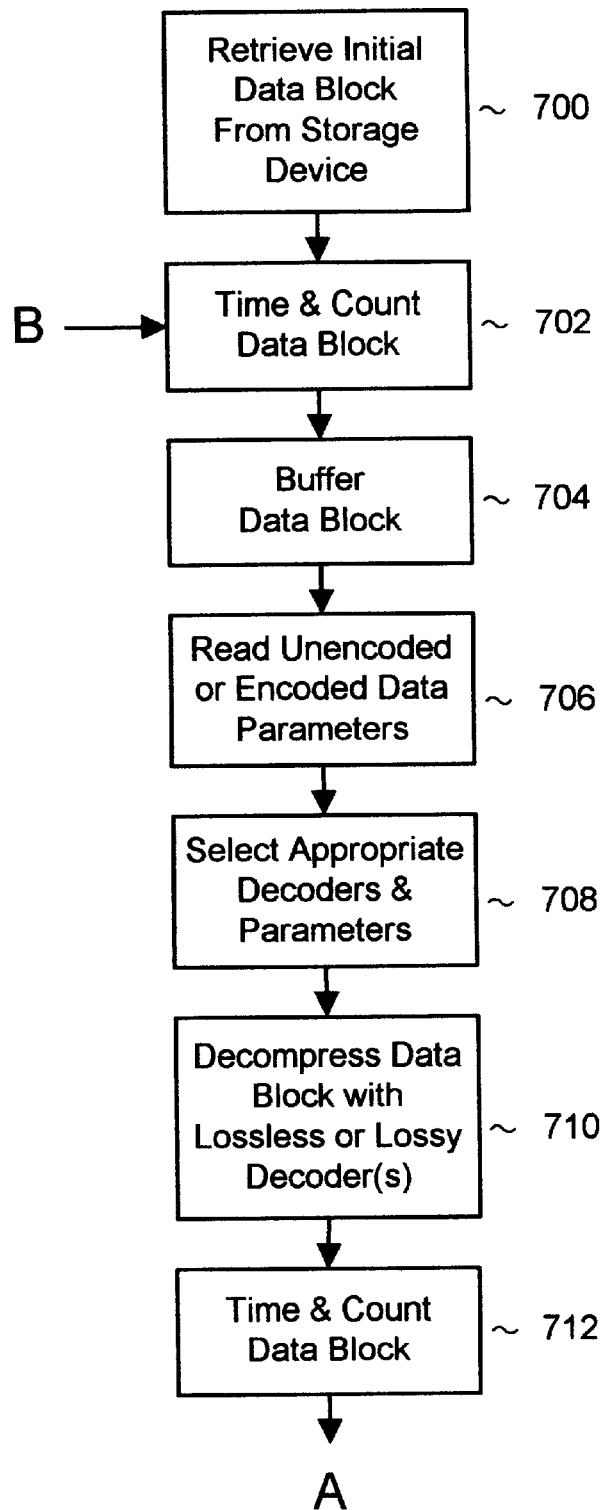
FIGS. 7a and 7b comprise a flow diagram of a method for accelerated data retrieval in accordance with a further aspect of the present invention.
Figure 7B:
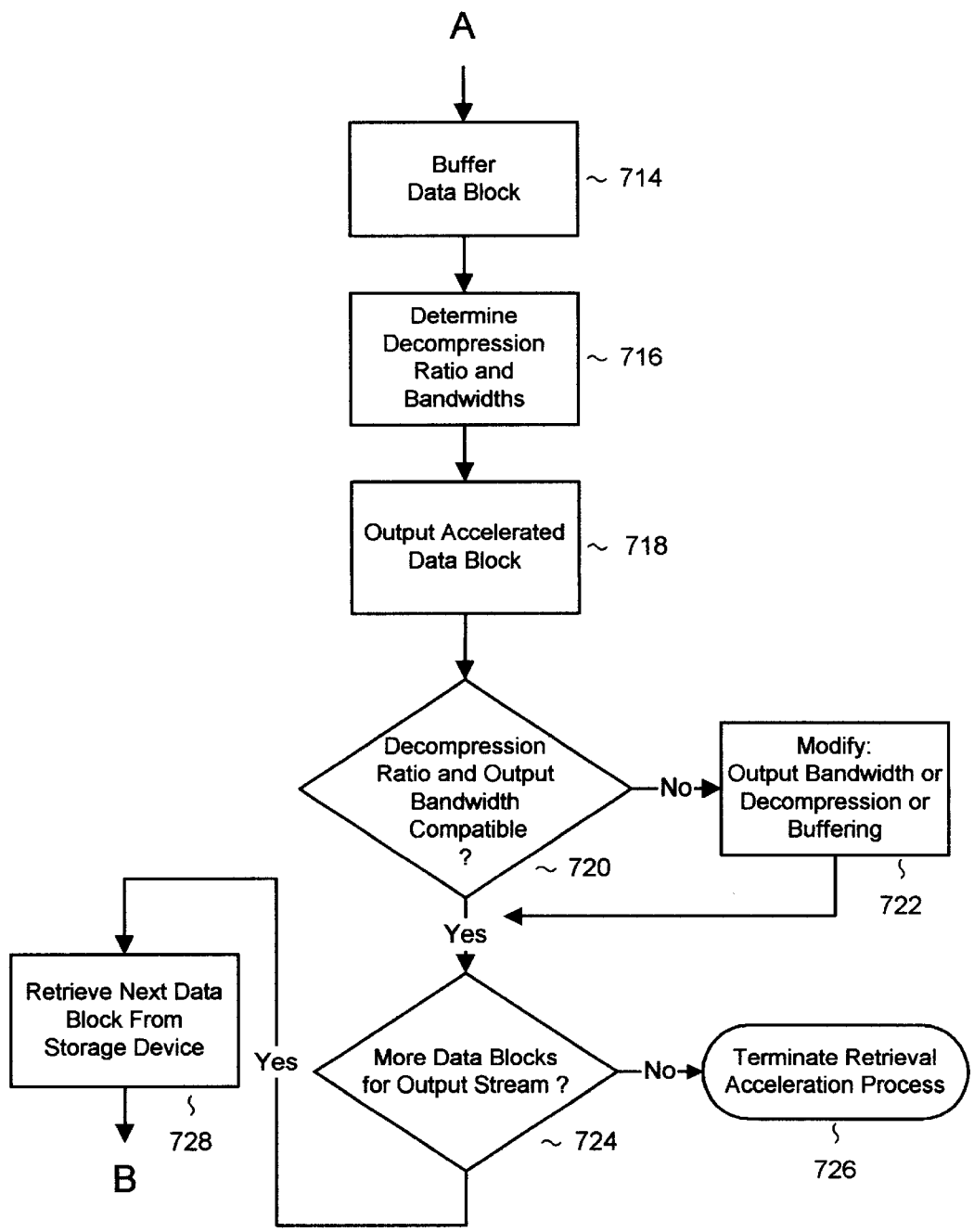

Referring now to FIGS. 7a and 7b, a flow diagram illustrates a method for accelerated data retrieval according to one aspect of the present invention. With this method, the data decompression ratio is not required to be less than or equal to the ratio of the data retrieval access rate to the maximum output data rate. As previously stated above, data decompression is performed on a per data block basis. Accordingly, the initial input data block is retrieved from the storage device (step 700) and is timed and counted (step 702). Timing and counting enables determination of the bandwidth of data retrieval. The retrieved data block is then buffered (step 704). Optionally, encoded or encoded data parameters may be read (step 706) to select the allowable lossless or lossy decoders and associated data parameters (step 708) using, for example, the techniques discussed above for the encoding process (e.g., steps 606 and 608, FIG. 6a).

Encoded data is then decompressed by the data retrieval accelerator 80 (step 710).

During and after the decoding of the input data block, the decoded data block is then timed and counted (step 712), thus enabling determination of the decompression ratio and decompression bandwidth. The decompressed, timed and counted data block is then buffered (step 714). The decompression ratio and bandwidths of the retrieved data and the decoder are then determined (step 716). The decompressed data block is then output (step 718). Checks or other forms of testing are applied to ensure that the data bandwidths of the retrieved data, data decompressor, and data output are compatible (step 720). If the bandwidths are not compatible, then one or more system parameters may be modified to make the bandwidths compatible (step 722). For instance, the data retrieval bandwidth may be adjusted either not accepting (continuously) data blocks retrieved from the data storage device or lowering the duty cycle of data blocks retrieved from the data storage device. In addition, one or more of the output data devices that receive the output data stream may be signaled or otherwise requested to accept a higher data rate. Moreover, a different type of decoding process may be applied to adjust the data decompression rate by applying, for example, lossless or lossy decoders, different decoding parameters, a single decoder, multiple parallel or sequential decoders, or any combination thereof. Also, additional temporary buffering of either the retrieved or output data or both may be utilized.

By way of example, assuming the data storage device 45 has a data retrieval rate of 20 MB/sec and the data retrieval accelerator 80 provides a 1:4 decompression ratio, then the output of the data retrieval accelerator 80 would be 80 MB/sec. If the maximum output data transmission rate that can be accepted from the data retrieval accelerator 80 is 60 MB/sec (which is lower than the data output data rate of 80 MB/sec of the data retrieval accelerator 80), data congestion and backup would occur at the output of the data retrieval accelerator 80. This problem may be solved by adjusting any one of the system parameters as discussed above, e.g., by adjusting the decompression ratio to provide a data output rate from the data storage accelerator 80 to be equal to the maximum accepted output data transmission rate.

On the other hand, if the bandwidths are compatible (or made compatible by adjusting one or more system parameters), then a check or other form of test is performed to see if there are additional data blocks available from the data storage device (step 724).

If no more data blocks are available for output, the retrieval acceleration process is terminated (step 726). If more data blocks are available to be retrieved from the data storage device, the next data block is retrieved (step 728) and the process repeats beginning with timing and counting of the retrieved data block (return to step 702).

It is to be understood that any conventional compression/decompression system and method (which comply with the above mentioned constraints) may be employed in the data storage accelerator 10 and data retrieval accelerator 80 for providing accelerated data storage and retrieval in accordance with the present invention. Preferably, the present invention employs the data compression/decompression techniques disclosed in U.S. Ser. No. 09/210,491 entitled "Content Independent Data Compression Method and System," filed on Dec. 11, 1998, which is commonly assigned and which is fully incorporated herein by reference. It is to be appreciated that the compression and decompression systems and methods disclosed in U.S. Ser. No. 09/210,491 are suitable for compressing and decompressing data at rates which provide accelerated data storage and retrieval.

Figure 8:
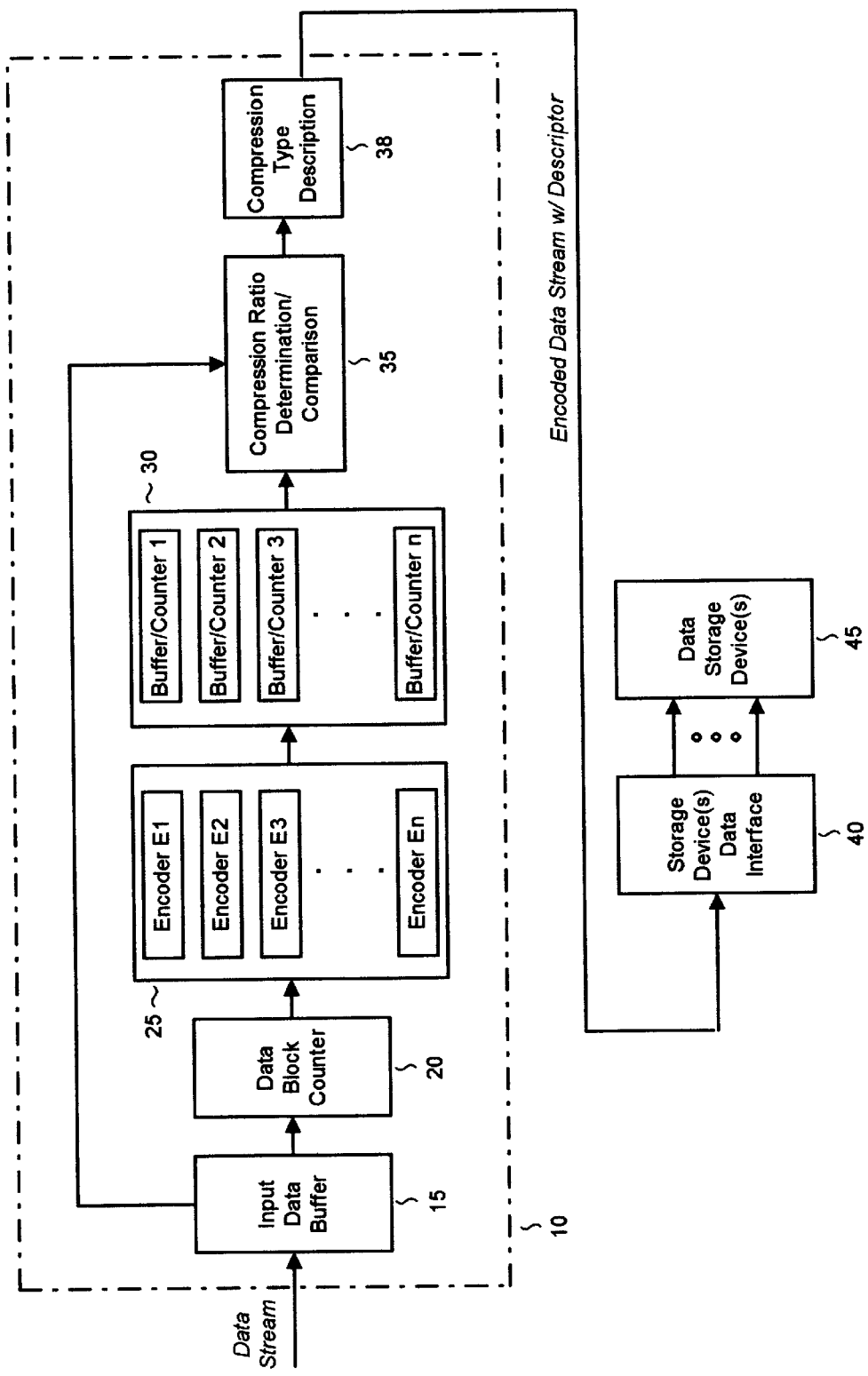
FIG. 8 is a detailed block diagram of a system for accelerated data storage according to a preferred embodiment of the present invention.

Referring now to FIG. 8, a detailed block diagram illustrates a preferred system for accelerated data storage which employs a compression system as disclosed in the above-incorporated U.S. Ser. No. 09/210,491. In this embodiment, the data storage accelerator 10 accepts data blocks from an input data stream and stores the input data block in an input buffer or cache 15. It is to be understood that the system processes the input data stream in data blocks that may range in size from individual bits through complete files or collections of multiple files. Additionally, the input data block size may be fixed or variable. A counter 20 counts or otherwise enumerates the size of input data block in any convenient units including bits, bytes, words, double words. It should be noted that the input buffer 15 and counter 20 are not required elements of the present invention. The input data buffer 15 may be provided for buffering the input data stream in order to output an uncompressed data stream in the event that, as discussed in further detail below, every encoder fails to achieve a level of compression that exceeds an a priori specified minimum compression ratio threshold.

Data compression is performed by an encoder module 25 which may comprise a set of encoders E1, E2, E3 . . . En. The encoder set E1, E2, E3 . . . En may include any number "n" (where n may=1) of those lossless encoding techniques currently well known within the art such as run length, Huffman, Lempel-Ziv Dictionary Compression, arithmetic coding, data compaction, and data null suppression. It is to be understood that the encoding techniques are selected based upon their ability to effectively encode different types of input data. It is to be appreciated that a full complement of encoders are preferably selected to provide a broad coverage of existing and future data types.

The encoder module 25 successively receives as input each of the buffered input data blocks (or unbuffered input data blocks from the counter module 20). Data compression is performed by the encoder module 25 wherein each of the encoders E1 . . . En processes a given input data block and outputs a corresponding set of encoded data blocks. It is to be appreciated that the system affords a user the option to enable/disable any one or more of the encoders E1 . . . En prior to operation. As is understood by those skilled in the art, such feature allows the user to tailor the operation of the data compression system for specific applications. It is to be further appreciated that the encoding process may be performed either in parallel or sequentially. In particular, the encoders E1 through En of encoder module 25 may operate in parallel (i.e., simultaneously processing a given input data block by utilizing task multiplexing on a single central processor, via dedicated hardware, by executing on a plurality of processor or dedicated hardware systems, or any combination thereof). In addition, encoders E1 through En may operate sequentially on a given unbuffered or buffered input data block. This process is intended to eliminate the complexity and additional processing overhead associated with multiplexing concurrent encoding techniques on a single central processor and/or dedicated hardware, set of central processors and/or dedicated hardware, or any achievable combination. It is to be further appreciated that encoders of the identical type may be applied in parallel to enhance encoding speed. For instance, encoder E1 may comprise two parallel Huffman encoders for parallel processing of an input data block.

A buffer/counter module 30 is operatively connected to the encoder module 25 for buffering and counting the size of each of the encoded data blocks output from encoder module 25. Specifically, the buffer/counter 30 comprises a plurality of buffer/counters BC1, BC2, BC3 . . . BCn, each operatively associated with a corresponding one of the encoders E1 . . . En. A compression ratio module 35, operatively connected to the output buffer/counter 30, determines the compression ratio obtained for each of the enabled encoders E1 . . . En by taking the ratio of the size of the input data block to the size of the output data block stored in the corresponding buffer/counters BC1 . . . BCn. In addition, the compression ratio module 35 compares each compression ratio with an a priori-specified compression ratio threshold limit to determine if at least one of the encoded data blocks output from the enabled encoders E1 . . . En achieves a compression that exceeds an a priori-specified threshold. As is understood by those skilled in the art, the threshold limit may be specified as any value inclusive of data expansion, no data compression or expansion, or any arbitrarily desired compression limit. A description module 38, operatively coupled to the compression ratio module 35, appends a corresponding compression type descriptor to each encoded data block which is selected for output so as to indicate the type of compression format of the encoded data block. A data compression type descriptor is defined as any recognizable data token or descriptor that indicates which data encoding technique has been applied to the data. It is to be understood that, since encoders of the identical type may be applied in parallel to enhance encoding speed (as discussed above), the data compression type descriptor identifies the corresponding encoding technique applied to the encoded data block, not necessarily the specific encoder. The encoded data block having the greatest compression ratio along with its corresponding data compression type descriptor is then output for subsequent data processing, storage, or transmittal. If there are no encoded data blocks having a compression ratio that exceeds the compression ratio threshold limit, then the original unencoded input data block is selected for output and a null data compression type descriptor is appended thereto. A null data compression type descriptor is defined as any recognizable data token or descriptor that indicates no data encoding has been applied to the input data block. Accordingly, the unencoded input data block with its corresponding null data compression type descriptor is then output for subsequent data processing, storage, or transmittal.

The data storage acceleration device 10 is connected to a data storage device interface 40. The function of the data storage interface 40 is to facilitate the formatting and transfer of data to one or more data storage devices 45. The data storage interface may be any of the data interfaces known to those skilled in the art such as SCSI (Small Computer Systems Interface), Fibre Channel, "Firewire", IEEE P1394, SSA (Serial Storage Architecture), IDE (Integrated Disk Electronics), and ATA/ATAPI interfaces. It should be noted that the storage device data interface 40 is not required for implementing the present invention. As before, the data storage device 45 may be any form of memory device including all forms of sequential, pseudo-random, and random access storage devices. The data storage device 45 may be volatile or non-volatile in nature, or any combination thereof. Storage devices as known within the current art include all forms of random access memory (RAM), magnetic and optical tape, magnetic and optical disks, along with various other forms of solid-state mass storage devices (e.g., ATA/ATAPI IDE disk). Thus it should be noted that the current invention applies to all forms and manners of memory devices including, but not limited to, storage devices utilizing magnetic, optical, and chemical techniques, or any combination thereof.

Again, it is to be understood that the embodiment of the data storage accelerator 10 of FIG. 8 is exemplary of a preferred compression system which may be implemented in the present invention, and that other compression systems and methods known to those skilled in the art may be employed for providing accelerated data storage in accordance with the teachings herein. Indeed, in another embodiment of the compression system disclosed in the above-incorporated U.S. Ser. No. 09/210,491, a timer is included to measure the time elapsed during the encoding process against an a priori-specified time limit. When the time limit expires, only the data output from those encoders (in the encoder module 25) that have completed the present encoding cycle are compared to determine the encoded data with the highest compression ratio. The time limit ensures that the real-time or pseudo real-time nature of the data encoding is preserved. In addition, the results from each encoder in the encoder module 25 may be buffered to allow additional encoders to be sequentially applied to the output of the previous encoder, yielding a more optimal lossless data compression ratio. Such techniques are discussed in greater detail in the above-incorporated U.S. Ser. No. 09/210,491.

Figure 9:
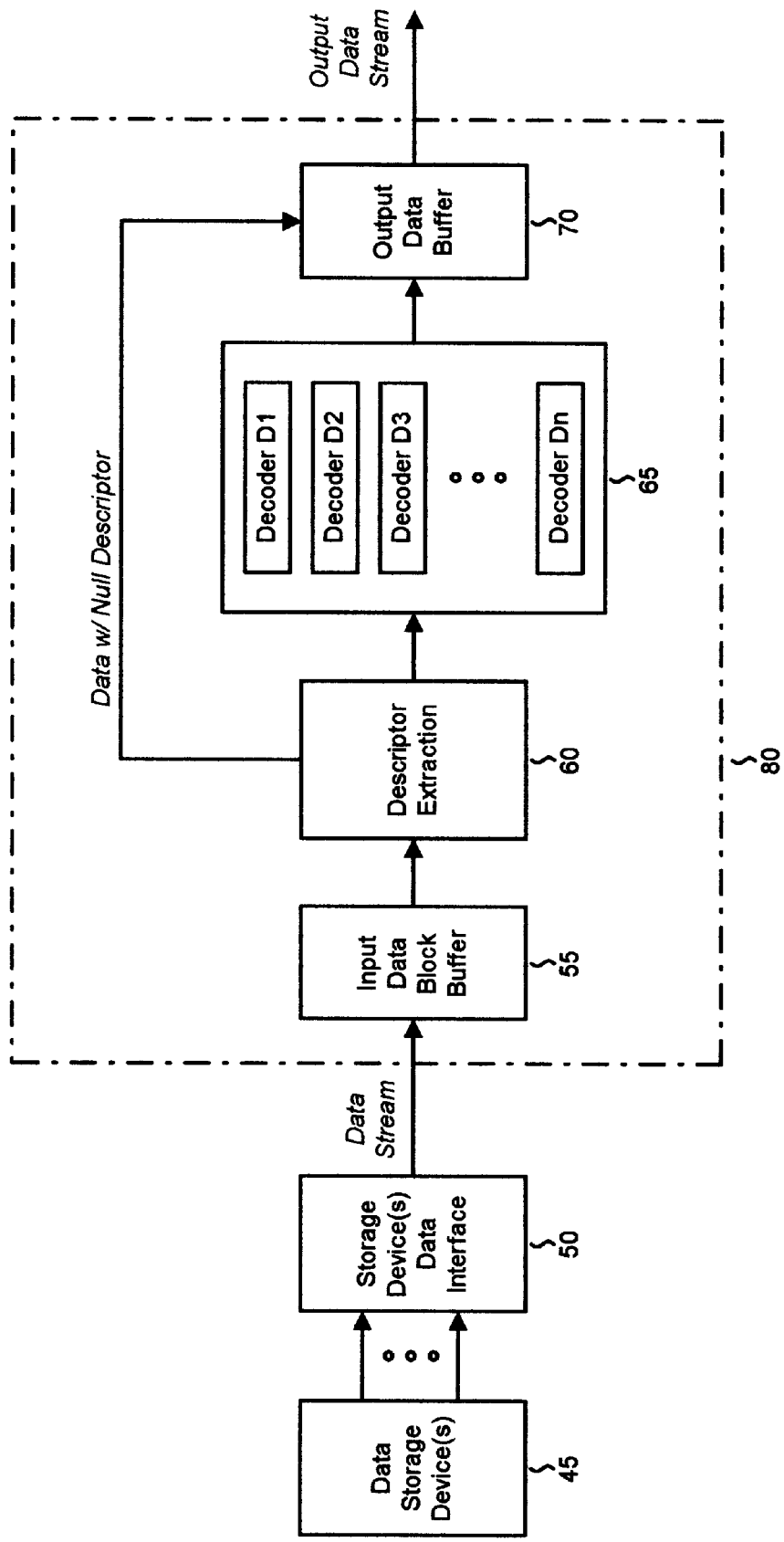
FIG. 9 is a detailed block diagram of a system for accelerated data retrieval according to a preferred embodiment of the present invention.

Referring now to FIG. 9, a detailed block diagram illustrates a preferred system for accelerated data retrieval employing a decompression system as disclosed in the above-incorporated U.S. Ser. No. 09/210,491. In this embodiment, the data retrieval accelerator 80 retrieves or otherwise accepts data blocks from one or more data storage devices 45 and inputs the data via a data storage interface 50. It is to be understood that the system processes the input data stream in data blocks that may range in size from individual bits through complete files or collections of multiple files. Additionally, the input data block size may be fixed or variable. As stated above, the memory storage device 45 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including storage devices utilizing magnetic, optical, and chemical techniques, or any combination thereof. The data storage device interface 50 converts the input data from the storage device format to a format useful for data decompression.

The storage device data interface 50 is operatively connected to the data retrieval accelerator 80 which is utilized for decoding the stored (compressed) data, thus providing accelerated retrieval of stored data. In this embodiment, the data retrieval accelerator 80 comprises an input buffer 55 which receives as input an uncompressed or compressed data stream comprising one or more data blocks. The data blocks may range in size from individual bits through complete files or collections of multiple files. Additionally, the data block size may be fixed or variable. The input data buffer 55 is preferably included (not required) to provide storage of input data for various hardware implementations. A descriptor extraction module 60 receives the buffered (or unbuffered) input data block and then parses, lexically, syntactically, or otherwise analyzes the input data block using methods known by those skilled in the art to extract the data compression type descriptor associated with the data block. The data compression type descriptor may possess values corresponding to null (no encoding applied), a single applied encoding technique, or multiple encoding techniques applied in a specific or random order (in accordance with the data compression system embodiments and methods discussed above).

A decoder module 65 includes one or more decoders D1 . . . Dn for decoding the input data block using a decoder, set of decoders, or a sequential set of decoders corresponding to the extracted compression type descriptor. The decoders D1 . . . Dn may include those lossless encoding techniques currently well known within the art, including: run length, Huffman, Lempel-Ziv Dictionary Compression, arithmetic coding, data compaction, and data null suppression. Decoding techniques are selected based upon their ability to effectively decode the various different types of encoded input data generated by the data compression systems described above or originating from any other desired source.

As with the data compression systems discussed in U.S. application Ser. No. 09/210,491, the decoder module 65 may include multiple decoders of the same type applied in parallel so as to reduce the data decoding time. The data retrieval accelerator 80 also includes an output data buffer or cache 70 for buffering the decoded data block output from the decoder module 65. The output buffer 70 then provides data to the output data stream. It is to be appreciated by those skilled in the art that the data retrieval accelerator 80 may also include an input data counter and output data counter operatively coupled to the input and output, respectively, of the decoder module 65. In this manner, the compressed and corresponding decompressed data block may be counted to ensure that sufficient decompression is obtained for the input data block.

Again, it is to be understood that the embodiment of the data retrieval accelerator 80 of FIG. 9 is exemplary of a preferred decompression system and method which may be implemented in the present invention, and that other data decompression systems and methods known to those skilled in the art may be employed for providing accelerated data retrieval in accordance with the teachings herein.

Figure 10:
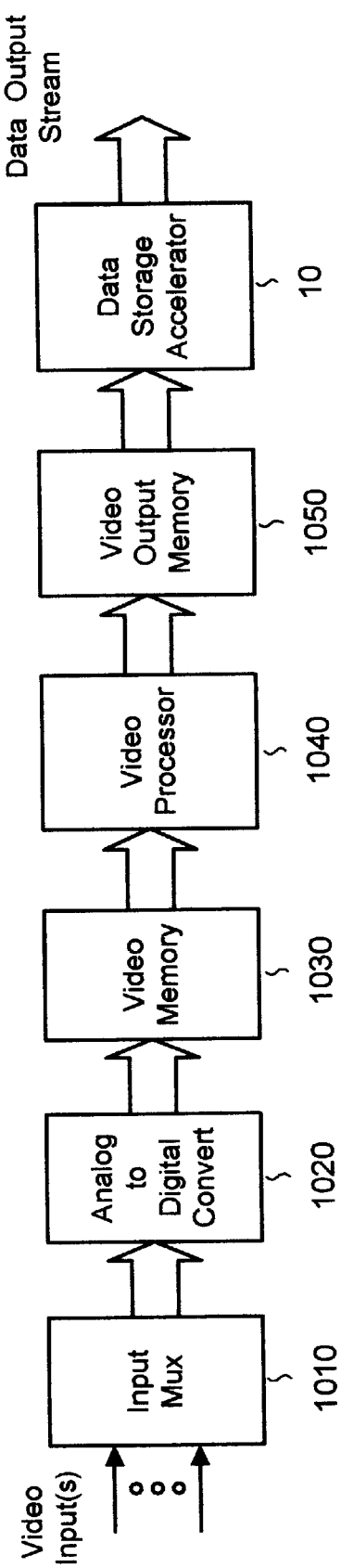
FIG. 10 is a block diagram of a system for accelerated video storage according to one embodiment of the present invention.

In accordance with another aspect of the present invention, the data storage and retrieval accelerator system and method may be employed in for increasing the storage rate of video data. In particular, referring now to FIG. 10, a block diagram illustrates a system for providing accelerated video data storage in accordance with one embodiment of the present invention. The video data storage acceleration system accepts as input one or more video data streams that are analog, digital, or any combination thereof in nature. The input multiplexer 1010 selects the initial video data stream for data compression and acceleration. The input multiplexer 1010 is operatively connected to an A/D converter 1020 which converts analog video inputs to digital format of desired resolution. The A/D converter 1020 may also include functions to strip video data synchronization to perform other data formatting functions. It should be noted that the analog-to-digital conversion process is not required for digital video inputs. The A/D converter 1020 is operatively connected a video memory 1030 that is, in turn, operatively connected to a video processor 1040. The video processor 1040 performs manipulation of the digital video data in accordance with any user desired processing functions. The video processor 1040 is operatively coupled to a video output memory 1050, that is operatively connected to a data storage accelerator 10 which compresses the video data to provide accelerated video data to the output data stream for subsequent data processing, storage, or transmittal of the video data. This video data acceleration process is repeated for all data blocks in the input data stream. If more video data blocks are available in the input data stream, the video multiplexer selects the next block of video for accelerated processing. Again, it is to be understood that the data storage accelerator 10 may employ any lossless or lossy data compression system which is capable of compressing data at a rate suitable for providing accelerated video data storage in accordance with the teachings herein.

Figure 11:
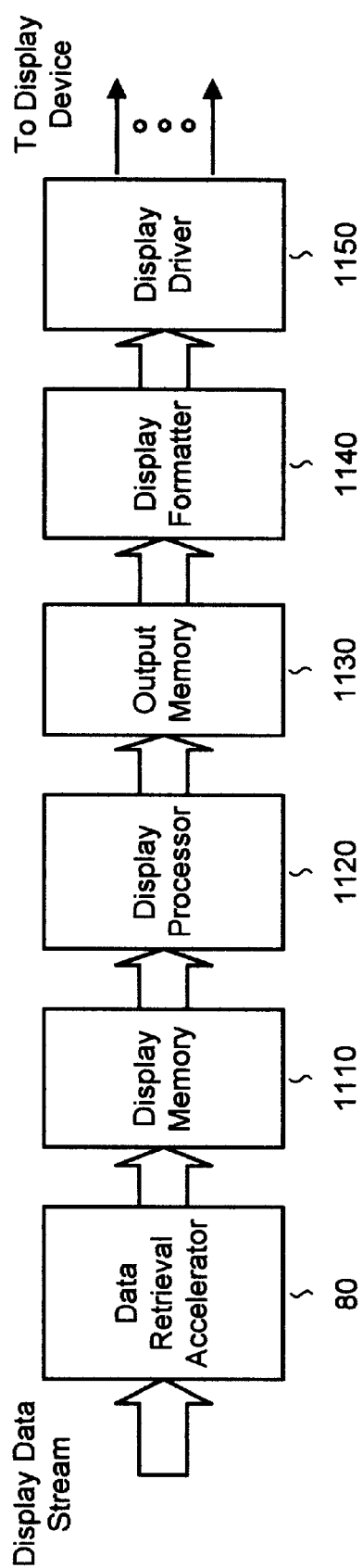
FIG. 11 is a block diagram of a system for accelerated retrieval of video data according to one embodiment of the present invention.

In accordance with another aspect of the present invention, the accelerated data storage and retrieval system may be employed in a display controller to reduce the time required to send display data to a display controller or processor. In particular, referring now to FIG. 11, a block diagram illustrates a display accelerator system in accordance with one embodiment of the present invention. The video display accelerator accepts as input one or more digital display data blocks from an input display data stream. It is to be understood that the system processes the input data stream in data blocks that may range in size from individual bits through complete files or collections of multiple files. Additionally, the input video data block size may be fixed or variable. The input data blocks are processed by a data retrieval accelerator 80 which employs lossless or lossy data decompression system in accordance with the teachings herein. Upon completion of data decompression, the decompressed data block is then output to a display memory 1110 that provides data to a display processor 1120. The display processor 1120 performs any user desired processing function. It is well known within the current art that display data is often provided in one or more symbolic formats such as Open Graphics Language (Open GL) or another display or image language. The display processor 1120 is operatively connected an output memory buffer 1130. The output memory 1130 supplies data to a display formatter 1140 that converts the data to a format compatible with the output display device or devices. Data from the display formatter 1140 is provided to the display driver 1150 that outputs data in appropriate format and drive signal levels to one or more display devices. It should be noted that the display memory 1110, display processor 1120, output memory 1130, display formatter 1140, and display driver 1150 are not required elements of the present invention.

Figure 12:
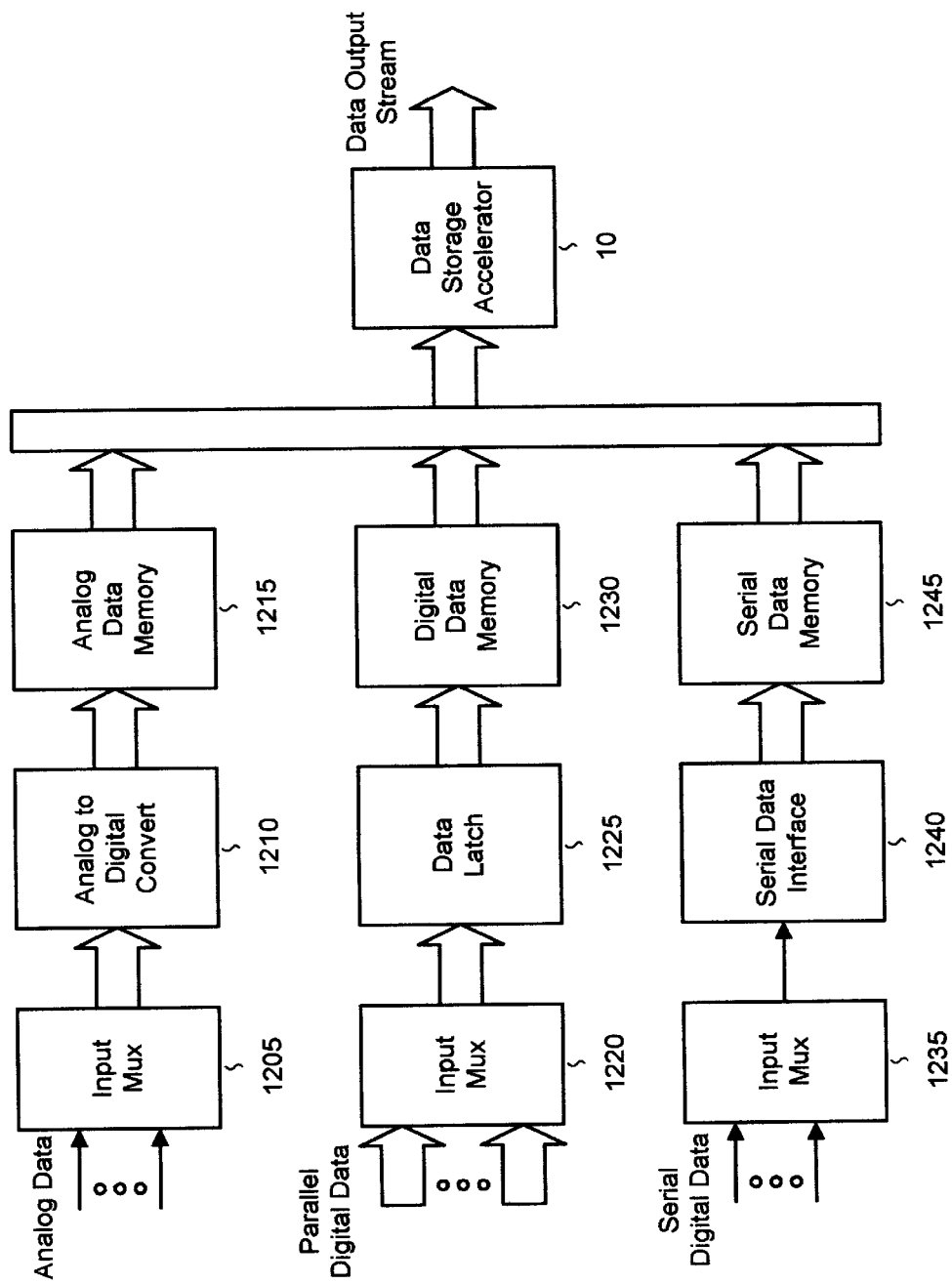
FIG. 12 is a block diagram of an input/output controller system for accelerated storage of analog, digital, and serial data according to one embodiment of the present invention.

In accordance with yet another aspect of the present invention, the data storage and retrieval accelerator system and method may be employed in an I/O controller to reduce the time for storing, retrieving or transmitting parallel data streams. In particular, referring now to FIG. 12, a block diagram illustrates a system for accelerated data storage of analog, digital, and serial data in accordance with one embodiment of the present invention. The data storage accelerator 10 is capable of accepting one or more simultaneous analog, parallel digital, and serial data inputs. An analog input multiplexer 1205 selects the initial analog data for data compression and acceleration. The analog input multiplexer 1205 is operatively connected to an A/D converter 1210 that converts the analog input signal to digital data of the desired resolution. The digitized data output of the A/D converter 1210 is stored in an analog data memory buffer 1215 for subsequent data storage acceleration. Similarly, a parallel digital data input multiplexer 1220 selects the initial parallel digital data for data compression and acceleration. The parallel digital data input multiplexer 1220 is operatively connected to an input data latch 1225 that holds the input parallel digital data. The parallel digital data is then stored in digital data memory buffer 1245 for subsequent data storage acceleration. In addition, a serial digital data input multiplexer 1235 selects the initial serial digital data for data compression and acceleration. The serial digital data input multiplexer 1235 is operatively connected to a serial data interface 1240 that converts the serial data stream to a format useful for data acceleration. The formatted serial digital data is then stored in serial data memory buffer 1245 for subsequent data acceleration. The analog data memory 1215, parallel digital data memory 1230, and serial data memory 1245 are operatively connected to the data storage accelerator device 10. Data is selected from each data memory subsystem based upon a user defined algorithm or other selection criteria. It should be noted that the analog input multiplexer 1205, A/D converter 1210, analog data memory 1215, parallel data input multiplexer 1220, data latch 1225, digital data memory 1230, serial data input multiplexer 1235, serial data interface 1240, serial data memory 1245, and counter 20 are no t required elements of the present invention. As stated above, the data storage accelerator 10 employs any of the data compression methods disclosed in the above incorporated U.S. Ser. No. 09/210, 491, or any conventional lossless or lossy data compression method suitable for compressing data at a rat e necessary for obtaining accelerated data storage. The data storage accelerator supplies accelerated data to the output data stream for subsequent data processing, storage, or transmittal.

Figure 13:
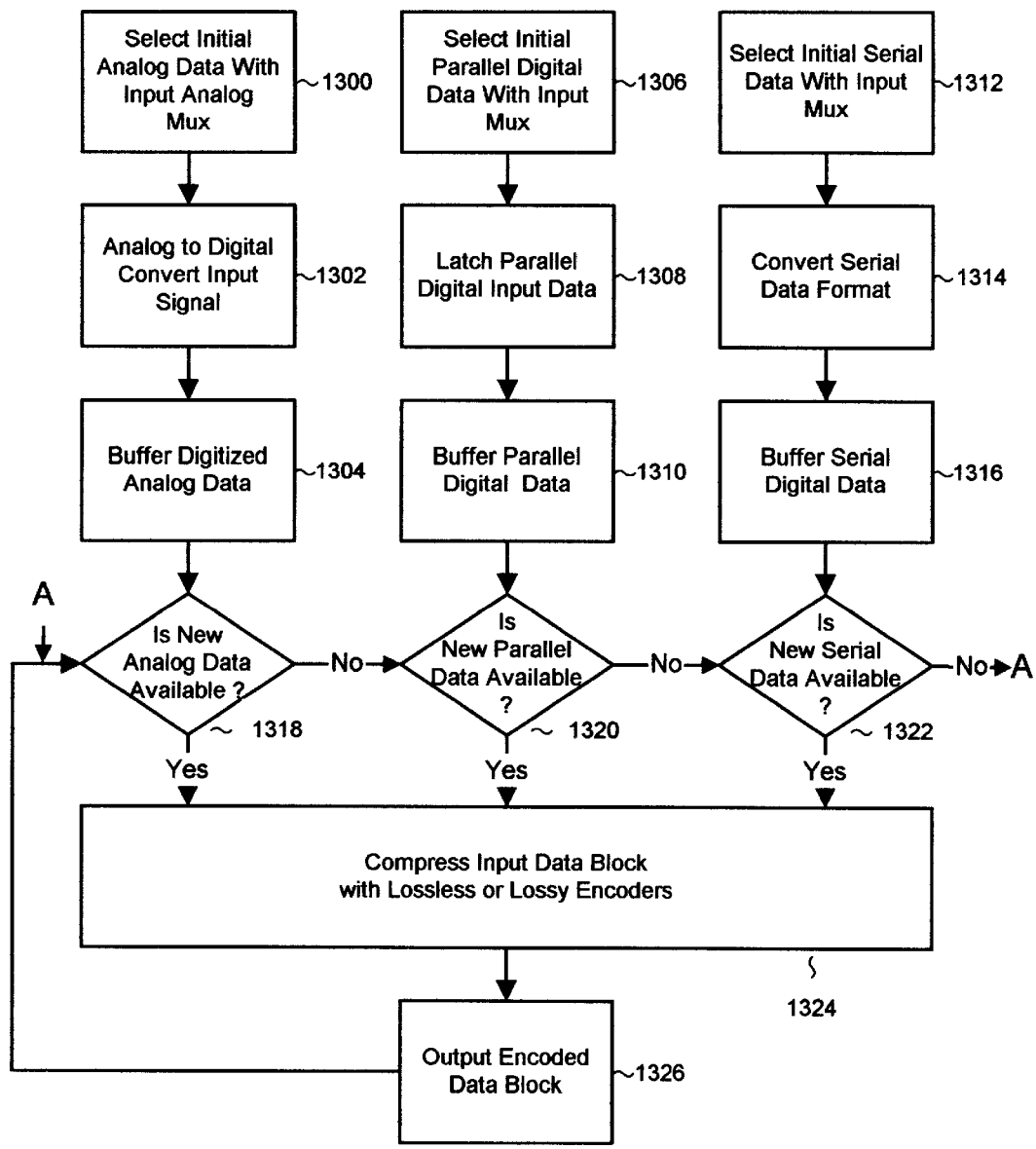
FIG. 13 is a flow diagram of a method for accelerated storage of analog, digital, and serial data according to one aspect of the present invention.

Referring now to FIG. 13, a flow diagram illustrates a method for accelerated data storage of analog, digital, and serial data according to one aspect of the present invention. The analog input multiplexer selects the initial analog data for data compression and acceleration (step 1300). The analog input multiplexer provides analog data to the A/D converter that convert s the analog input signal to digital data of the desired resolution (step 1302). The digitized data output of the A/D converter is then buffered in the analog data memory buffer (step 1304) for subsequent data acceleration. Similarly, the parallel digital data multiplexer selects the initial parallel digital data for data compression and acceleration (step 1306). The parallel digital data multiplexer provides data to the input data latch that then holds the input parallel digital data (step 1308). The parallel digital data is then stored in digital data memory buffer for subsequent data acceleration (step 1310). The serial digital data input multiplexer selects the initial serial digital data for lossiless or lossy data compression and acceleration (step 1312). The serial digital data input multiplexer provides serial data to the serial data interface that converts the serial data stream to a format useful for data acceleration (step 1314). The formatted serial digital data is then stored in the serial data memory buffer for subsequent data acceleration (step 1316). A test or other check is performed to see if new analog data is avail able (step 1318). If no new analog data is available a second check is performed to see if new parallel data is available (step 1320). If no new parallel data is available, a third test is performed to see if new serial data i s available (step 1322). If no new serial data is available (step 1322) the test sequence repeats with the test for new analog data (step 1318). If new analog data block is available (step 1318), or if new parallel data block is available (step 1320), or if new serial data block is available (step 1322), the input data block is compressed by the data storage accelerator (step 1324) utilizing any lossless or lossy compression method suitable for providing accelerated data storage in accordance with the teachings herein. After data compression is complete, the compressed data block is then output subsequent accelerated data processing, storage, or transmittal (step 1326). After outputting data the process repeats beginning with a test for new analog data (return to step 1318).

Figure 14:
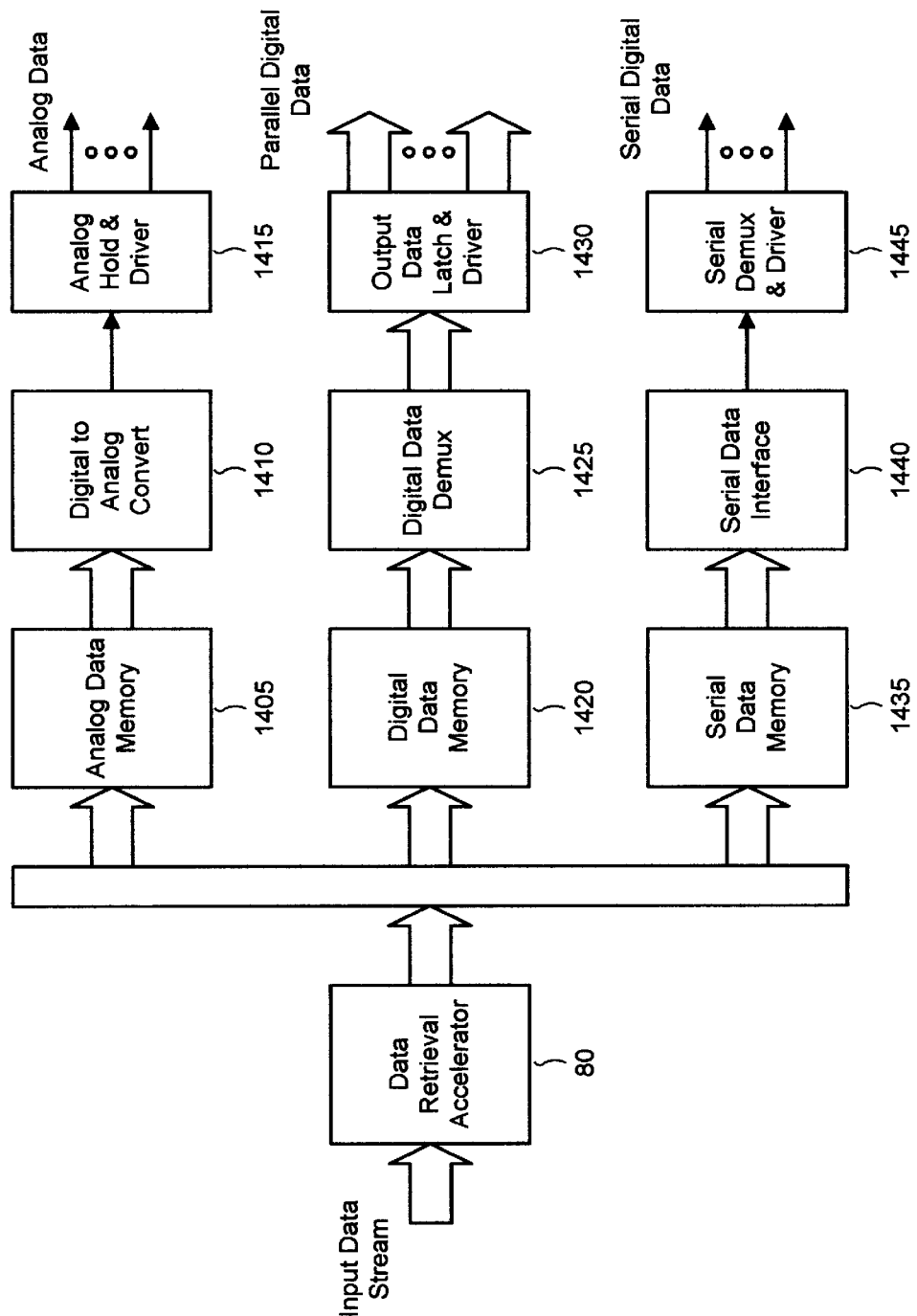
FIG. 14 is a block diagram of an input/output system for accelerated retrieval of analog, digital, and serial data according to one embodiment of the present invention.

Referring now to FIG. 14, a block diagram illustrates a system for accelerated retrieval of analog, digital, and serial data in accordance with one embodiment of the present invention. A data retrieval accelerator 80 receives data from an input data stream. It is to be understood that the system processes the input data stream in data blocks that may range in size from individual bits through complete files or collections of multiple files. Additionally, the input data block size may be fixed or variable. The data retrieval accelerator 80 decompresses the input data utilizing any of the lossless or lossy decompression methods suitable for providing accelerated data retrieval in accordance with the teachings herein. The data retrieval accelerator 80 is operatively connected to analog data memory 1405, digital data memory 1420, and serial data memory 1435. Dependent upon the type of input data block, the decoded data block is stored in the appropriate analog 1405, digital 1420, or serial 1435 data memory.

The analog data memory 1405 is operatively connected to a D/A converter 1410 that converts the decompressed digital data block into an analog signal. The D/A converter 1410 is further operatively connected to an analog hold and output driver 1415. The analog hold and output driver 1415 demultiplexes the analog signal output from the D/A converter 1410, samples and holds the analog data, and buffers the output analog data.

In a similar manner, the digital data memory 1420 is operatively connected to a digital data demultiplexer 1425 that routes the decompressed parallel digital data to the output data latch and driver 1430. The output latch and driver 1430 holds the digital data and buffers the parallel digital output.

Likewise, the serial data memory 1435 is operatively connected to a serial data interface 1440 that converts the decompressed data block to an output serial data stream. The serial data interface 1440 is further operatively connected to the serial demultiplexer and driver 1445 that routes the serial digital data to the appropriate output and buffers the serial data output.

Figure 15A:
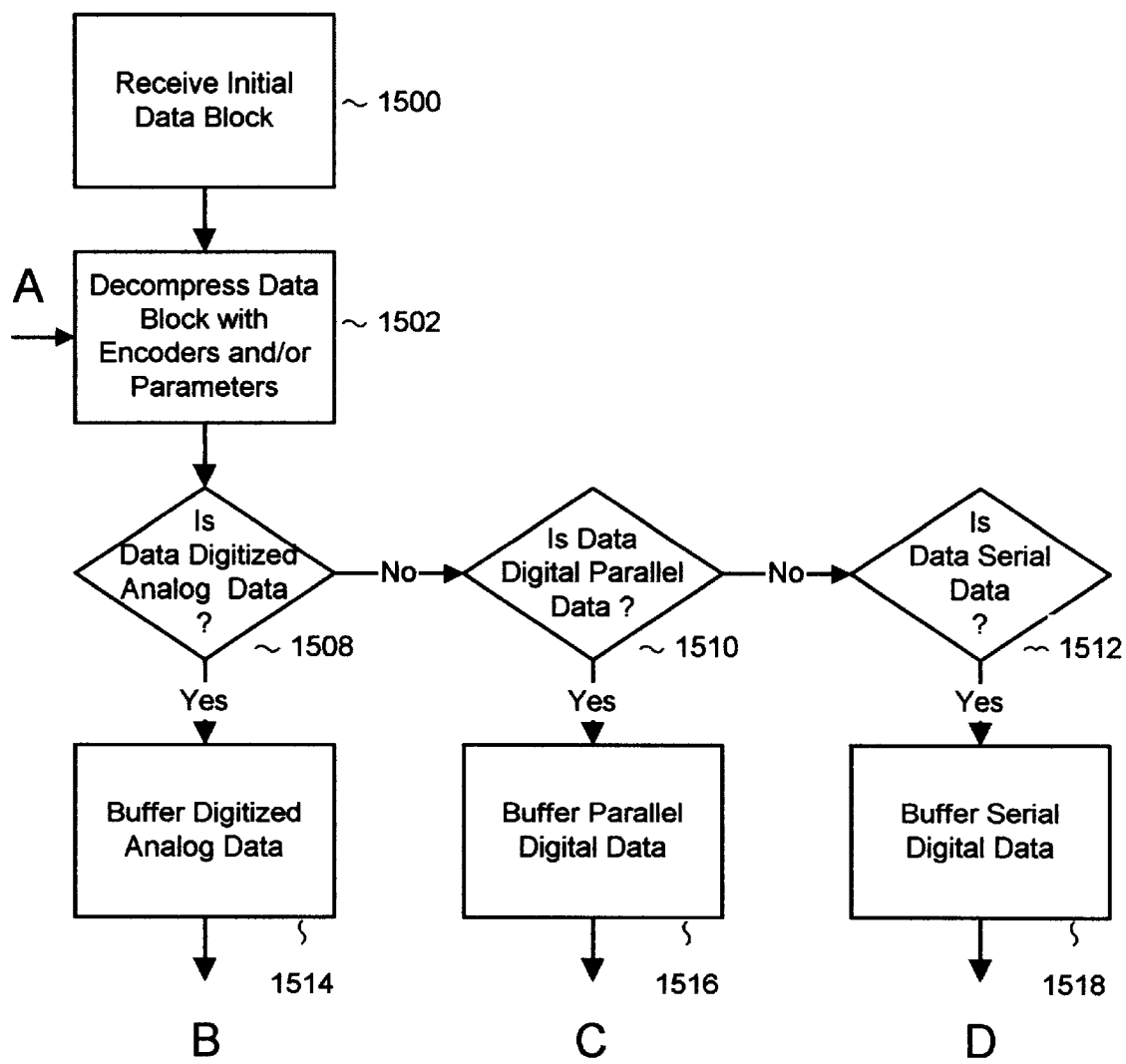
FIGS. 15a and 15b comprise a flow diagram of method for accelerated retrieval of analog, digital, and serial data according to one aspect of the present invention.
Figure 15B:
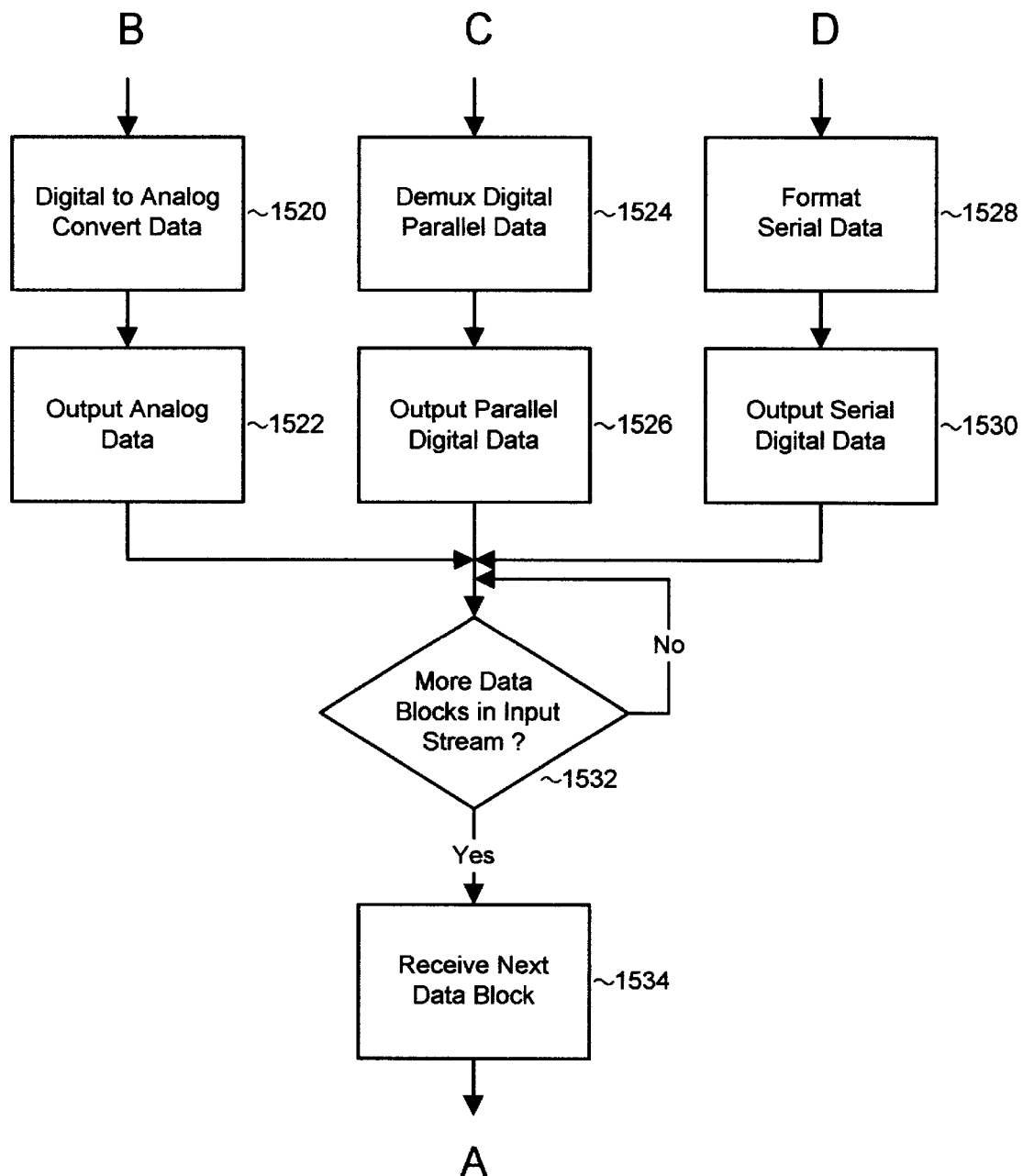

Referring now to FIGS. 15a and 15b, a flow diagram illustrates a method for accelerated retrieval of analog, digital, and serial data according to one aspect of the present invention. An initial data block is received (step 1500) and then decompressed by the data storage retrieval accelerator (step 1502) utilizing lossless or lossy data decompression (as discussed above, for example, with reference to FIGS. 7a and 7b). Upon completion of data decompression, a test or other check is performed to see if the data block is digitized analog data (step 1508). If the data block is not digitized analog data, a second check is performed to see if the data block is parallel digital data (step 1510). If the data block is not parallel digital data, a third test is performed to see if the data block serial data (step 1512). The result of at least one of the three tests will be affirmative.

If the data block is comprised of digitized analog data, the decoded data block is buffered in an "analog" digital data memory (step 1514). The decoded data block is then converted to an analog signal by a D/A converter (step 1520). The analog signal is then output (step 1522).

If the data block is comprised of parallel digital data, the decoded data block is buffered in a "parallel" digital data memory (step 1516). The decoded data block is then demultiplexed (step 1524) and routed to the appropriate the output data latch and driver. The output latch and driver then holds the digital data and buffers the parallel digital output (step 1526).

If the data block is comprised of serial data, the decoded data block is buffered in "serial" digital data memory (step 1518). The decoded data is then formatted to a serial data format (step 1528). The serial data is then demultiplexed, routed to the appropriate output, and output to a buffer (step 1530).

Upon output of analog data (step 1522), parallel digital data (step 1526), or serial digital data (step 1530), a test or other form of check is performed for more data blocks in the input stream (step 1532). If no more data blocks are available, the test repeats (return to step 1532). If a data block is available, the next data block is received (step 1534) and the process repeats beginning with step 1502.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A program storage device readable by machine, tangibly embodying a program of instructions executable by the machine to perform method steps for providing accelerated data storage, said method steps comprising:

receiving a digital data stream at an input data transmission rate which is greater than a data storage rate of a target storage device;

compressing the digital data stream at a compression rate that increases the effective data storage rate of the target storage device; and storing the compressed digital data stream in the target storage device, wherein the instructions for performing the step of compressing comprise instructions for performing the steps of:

reading a first parameter that is indicative of a compression type to be applied to the input digital data stream; and selecting at least one allowable encoder based on the first parameter.

2. The program storage device of claim 1, wherein the compression rate is at least equal to the ratio of the input data transmission rate to the data storage rate so as to provide continuous storage of the input digital data stream at the input data transmission rate.

3. The program storage device of claim 1, wherein the instructions for performing the step of compressing comprise instructions for performing lossy data compression.

4. The program storage device of claim 1, wherein the instructions for performing the step of compressing step comprise instructions for performing lossless and lossy data compression.

5. The program storage device of claim 1, wherein the compression type is one of lossless data compression, lossy data compression, and a combination thereof.

6. The program storage device of claim 1, wherein the input digital data stream comprises a plurality of data blocks and wherein each data block has a first parameter associated therewith indicative of a compression type to be applied to the data block.

7. The program storage device of claim 1, further comprising instructions for performing the step of reading a second data parameter that is indicative of an amount of information loss that is permissible, if lossy data compression is selected.

8. The program storage device of claim 7, wherein the first and second data parameters are located within a header of the data block.

9. A method providing accelerated data storage, comprising the steps of:

receiving a digital data stream at an input data transmission rate which is greater than a data storage rate of a target storage device;

compressing the digital data stream at a compression rate that increases the effective data storage rate of the target storage device; and storing the compressed digital data stream in the target storage device, wherein the step of compressing comprises the steps of:

reading a first parameter that is indicative of a compression type to be applied to the input digital data stream; and selecting at least one allowable encoder based on the first parameter.

10. The method of claim 9, wherein the compression rate is at least equal to the ratio of the input data transmission rate to the data storage rate so as to provide continuous storage of the input digital data stream at the input data transmission rate.

11. The method of claim 9, wherein the step of compressing is performed using lossy data compression.

12. The method of claim 9, wherein the step of compressing is performed using lossless and lossy data compression.

13. The method of claim 9, wherein the compression type is one of lossless data compression, lossy data compression, and a combination thereof.

14. The method of claim 9, wherein the input digital data stream comprises a plurality of data blocks and wherein each data block has a first parameter associated therewith indicative of a compression type to be applied to the data block.

15. The method of claim 9, further comprising the step of reading a second parameter that is indicative of an amount of information loss that is permissible, if lossy data compression is selected.

16. The method of claim 15, wherein the first and second parameters are located within a header of the data block.

* * * * *

(12) INTER PARTES REEXAMINATION CERTIFICATE (470th)
United States Patent
Fallon

(10) Number: US 6,604,158 C1
(45) Certificate Issued: Oct. 10, 2012

(54) SYSTEMS AND METHODS FOR ACCELERATED DATA STORAGE AND RETRIEVAL

(75) Inventor: James J. Fallon, Armonk, NY (US)

(73) Assignee: Realtime Data, LLC, New York, NY (US)

Reexamination Request:
No. 95/000,486, Jul. 8, 2009

Reexamination Certificate for:
Patent No.: 6,604,158
Issued: Aug. 5, 2003
Appl. No.: 09/481,243
Filed: Jan. 11, 2000

Related U.S. Application Data

(63) Continuation-in-part of application No. 09/266,394, filed on Mar. 11, 1999, now Pat. No. 6,601,104.

(51) Int. Cl.
*G06F 13/12* (2006.01)
(52) U.S. Cl. .............................. 710/65; 710/68; 709/246
(58) Field of Classification Search .......................... None
See application file for complete search history.

(56) References Cited

To view the complete listing of prior art documents cited during the proceeding for Reexamination Control Number 95/000,486, please refer to the USPTO's public Patent Application Information Retrieval (PAIR) system under the Display References tab.

*Primary Examiner* — Kavita Padmanabhan

(57) ABSTRACT

Systems and methods for providing accelerated data storage and retrieval utilizing lossless and/or lossy data compression and decompression. A data storage accelerator includes one or a plurality of high speed data compression encoders that are configured to simultaneously or sequentially losslessly or lossy compress data at a rate equivalent to or faster than the transmission rate of an input data stream. The compressed data is subsequently stored in a target memory or other storage device whose input data storage bandwidth is lower than the original input data stream bandwidth. Similarly, a data retrieval accelerator includes one or a plurality of high speed data decompression decoders that are configured to simultaneously or sequentially losslessly or lossy decompress data at a rate equivalent to or faster than the input data stream from the target memory or storage device. The decompressed data is then output at rate data that is greater than the output rate from the target memory or data storage device. The data storage and retrieval accelerator method and system may employed: in a disk storage adapter to reduce the time required to store and retrieve data from computer to disk; in conjunction with random access memory to reduce the time required to store and retrieve data from random access memory; in a display controller to reduce the time required to send display data to the display controller or processor; and/or in an input/output controller to reduce the time required to store, retrieve, or transmit data.

At the time of issuance and publication of this certificate, the patent remains subject to pending reexamination control number 95/001,923 filed Mar. 2, 2012. The claim content of the patent may be subsequently revised if a reexamination certificate issues from the reexamination proceeding.

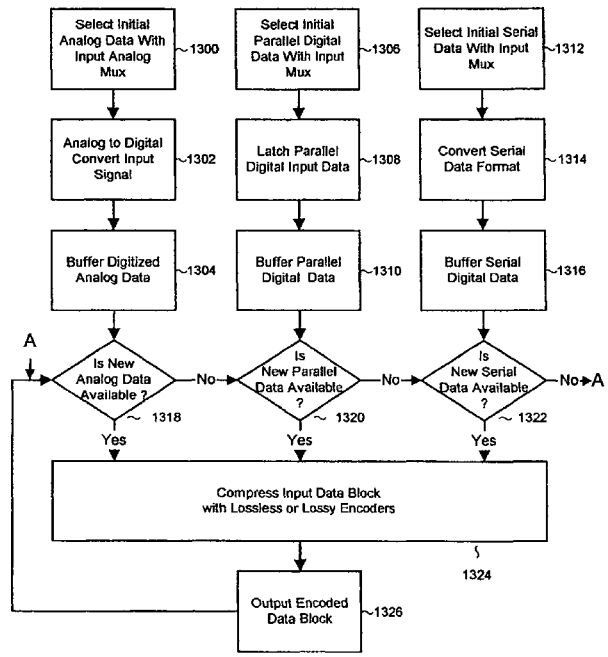

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1, 5, 6, 9, 13 and 14 are cancelled.

Claims 2-4, 7, 8, 10-12, 15 and 16 were not reexamined.

* * * * *

(12) INTER PARTES REEXAMINATION CERTIFICATE (1092nd)
United States Patent
Fallon

(10) Number: US 6,604,158 C2
(45) Certificate Issued: Apr. 17, 2015

(54) SYSTEM AND METHODS FOR ACCELERATED DATA STORAGE AND RETRIEVAL

(75) Inventor: James J. Fallon, Armonk, NY (US)

(73) Assignee: Realtime Data, LLC, New York, NY (US)

Reexamination Request:
No. 95/001,923, Mar. 2, 2012

Reexamination Certificate for:
Patent No.: 6,604,158
Issued: Aug. 5, 2003
Appl. No.: 09/481,243
Filed: Jan. 11, 2000

Reexamination Certificate C1 6,604,158 issued Oct. 10, 2012

Related U.S. Application Data

(63) Continuation-in-part of application No. 09/266,394, filed on Mar. 11, 1999, now Pat. No. 6,601,104.

(51) Int. Cl.
*G06F 13/12* (2006.01)
*G06F 13/00* (2006.01)
*G06F 3/06* (2006.01)
*H04N 21/426* (2011.01)

(Continued)

(52) U.S. Cl.
CPC ............ *G06F 3/0608* (2013.01); *G06F 3/0676* (2013.01); *H04N 21/42661* (2013.01); *H04N 21/4325* (2013.01); *H04N 21/231* (2013.01); *H04N 5/781* (2013.01); *H04N 19/176* (2014.11); *H04N 21/232* (2013.01); *H04N 21/4334* (2013.01); *H04N 9/8042* (2013.01); *H03M 7/30* (2013.01); *H04N 19/152* (2014.11); *H04N 19/115* (2014.11); *H04N 19/15* (2014.11); *G06F 3/0638* (2013.01); *G06F 3/0674* (2013.01); *G11B 2020/10759* (2013.01); *H04N 5/843* (2013.01); *H04N 5/85* (2013.01); *H04N 5/907* (2013.01); *H04N 9/8227* (2013.01)

(58) Field of Classification Search
None
See application file for complete search history.

(56) References Cited

To view the complete listing of prior art documents cited during the proceeding for Reexamination Control Number 95/001,923, please refer to the USPTO's public Patent Application Information Retrieval (PAIR) system under the Display References tab.

*Primary Examiner* — Cameron Saadat

(57) ABSTRACT

Systems and methods for providing accelerated data storage and retrieval utilizing lossless and/or lossy data compression and decompression. A data storage accelerator includes one or a plurality of high speed data compression encoders that are configured to simultaneously or sequentially losslessly or lossy compress data at a rate equivalent to or faster than the transmission rate of an input data stream. The compressed data is subsequently stored in a target memory or other storage device whose input data storage bandwidth is lower than the original input data stream bandwidth. Similarly, a data retrieval accelerator includes one or a plurality of high speed data decompression decoders that are configured to simultaneously or sequentially losslessly or lossy decompress data at a rate equivalent to or faster than the input data stream from the target memory or storage device. The decompressed data is then output at rate data that is greater than the output rate from the target memory or data storage device. The data storage and retrieval accelerator method and system may employed: in a disk storage adapter to reduce the time required to store and retrieve data from computer to disk; in conjunction with random access memory to reduce the time required to store and retrieve data from random access memory; in a display controller to reduce the time required to send display data to the display controller or processor, and/or in an input/output controller to reduce the time required to store, retrieve, or transmit data.

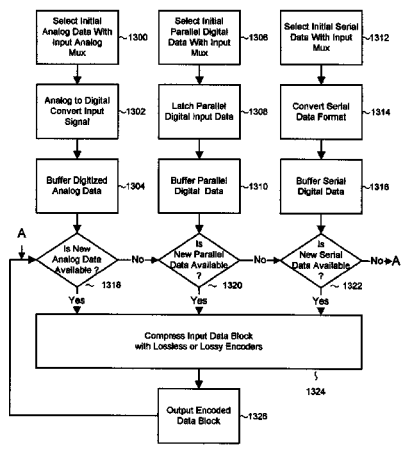

(51) Int. Cl.
*H04N 21/432* (2011.01)
*H04N 21/231* (2011.01)
*H04N 5/781* (2006.01)
*H04N 19/176* (2014.01)
*H04N 21/232* (2011.01)
*H04N 21/433* (2011.01)
*H04N 9/804* (2006.01)
*H03M 7/30* (2006.01)
*H04N 19/152* (2014.01)
*H04N 19/115* (2014.01)
*H04N 19/15* (2014.01)
*G11B 20/10* (2006.01)
*H04N 5/84* (2006.01)
*H04N 5/85* (2006.01)
*H04N 5/907* (2006.01)
*H04N 9/82* (2006.01)

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 5-6, 9, 13 and 14 were previously cancelled.

Claims 3, 4, 7, 11, 12 and 15 are determined to be patentable as amended.

New claims 17-22 are added and determined to be patentable.

Claims 2, 8, 10 and 16 were not reexamined.

3. The program storage device of claim [1] *17*, wherein the instructions for performing the step of compressing comprise instructions for performing lossy data compression.

4. The program storage device of claim [1] *17*, wherein the instructions for performing the step of compressing step comprise instructions for performing lossless and lossy data compression.

7. The program storage device of claim [1] *17*, further comprising instructions for performing the step of reading a second data parameter that is indicative of an amount of information loss that is permissible, if lossy data compression is selected.

11. The method of claim [9] *20*, wherein the step of compressing is performed using lossy data compression.

12. The method of claim [9] *21*, wherein the step of compressing is performed using lossless and lossy data compression.

15. The method of claim [9] *20*, further comprising the step of reading a second parameter that is indicative of an amount of information loss that is permissible, if lossy data compression is selected.

*17. A program storage device readable by machine, tangibly embodying a program of instructions executable by the machine to perform method steps for providing accelerated data storage, said method comprising:*

*receiving a digital data stream at an input data transmission rate that is greater than a data storage rate of a target storage device;*

*compressing the digital data stream at a compression rate that increases the effective data storage rate of the target storage device;*

*determining a bandwidth of the received data stream;*

*modifying one or more system parameters to adjust the bandwidth of the received data stream and a bandwidth of a data compressor to make the bandwidths of the received data stream and the data compressor compatible with a bandwidth of the target storage device; and*

*storing the compressed digital data stream in the target storage device,*

*wherein the instructions for performing the step of compressing comprise instructions for performing the steps of:*

*reading a first parameter that is indicative of a compression type to be applied to the input digital data stream; and*

*selecting at least one allowable encoder based on the first parameter.*

*18. The program storage device of claim 17, wherein the compression type is one of lossless data compression, lossy data compression, and a combination thereof.*

*19. The program storage device of claim 17, wherein the input digital data stream comprises a plurality of data blocks and wherein each data block has a first parameter associated therewith indicative of a compression type to be applied to the data block.*

*20. A method providing accelerated data storage, comprising the steps of:*

*receiving a digital data stream at an input data transmission rate that is greater than a data storage rate of a target storage device;*

*compressing the digital data stream at a compression rate that increases the effective data storage rate of the target storage device;*

*determining a bandwidth of the received data stream;*

*modifying one or more system parameters to adjust a bandwidth of the received data stream and a bandwidth of a data compressor to make the bandwidths of the received data stream and the data compressor compatible with a bandwidth of the target storage device; and*

*storing the compressed digital data stream in the target storage device,*

*wherein the step of compressing comprises the steps of:*

*reading a first parameter that is indicative of a compression type to be applied to the input digital data stream; and*

*selecting at least one allowable encoder based on the first parameter.*

*21. The method of claim 20, wherein the compression type is one of lossless data compression, lossy data compression, and a combination thereof.*

*22. The method of claim 20, wherein the input digital data stream comprises a plurality of data blocks and wherein each data block has a first parameter associated therewith indicative of a compression type to be applied to the data block.*

* * * * *